(12) United States Patent
Mutou

(10) Patent No.: US 10,501,621 B2
(45) Date of Patent: Dec. 10, 2019

(54) POLYESTER RESIN COMPOSITION, INJECTION MOLDED ARTICLE, LIGHT-REFLECTING BASE BODY, AND LIGHT-REFLECTING BODY

(71) Applicant: Mitsubishi Engineering-Plastics Corporation, Minato-ku (JP)

(72) Inventor: Fumihiro Mutou, Hiratsuka (JP)

(73) Assignee: Mitsubishi Engineering-Plastics Corporation, Minato-ku (JP)

(*) Notice: Subject to any disclaimer, the term of this patent is extended or adjusted under 35 U.S.C. 154(b) by 290 days.

(21) Appl. No.: 15/315,006

(22) PCT Filed: Jul. 1, 2015

(86) PCT No.: PCT/JP2015/068953
§ 371 (c)(1),
(2) Date: Nov. 30, 2016

(87) PCT Pub. No.: WO2016/002831
PCT Pub. Date: Jan. 7, 2016

(65) Prior Publication Data
US 2017/0190906 A1 Jul. 6, 2017

(30) Foreign Application Priority Data
Jul. 1, 2014 (JP) .................. 2014-135831

(51) Int. Cl.
*C08L 67/02* (2006.01)
*G02B 5/08* (2006.01)
*G02B 1/04* (2006.01)
*C23C 14/14* (2006.01)

(52) U.S. Cl.
CPC .............. *C08L 67/02* (2013.01); *C23C 14/14* (2013.01); *G02B 1/04* (2013.01); *G02B 5/0808* (2013.01); *C08L 2205/025* (2013.01); *C08L 2205/03* (2013.01); *C08L 2205/035* (2013.01); *C08L 2205/06* (2013.01)

(58) Field of Classification Search
CPC ........................ C08K 3/26; C08K 2201/003
See application file for complete search history.

(56) References Cited

U.S. PATENT DOCUMENTS

| | | | | |
|---|---|---|---|---|
| 2009/0179035 A1* | 7/2009 | Agarwal | ................. | C08L 67/02 220/645 |
| 2009/0208751 A1* | 8/2009 | Green | ................. | B82Y 30/00 428/402 |
| 2010/0309571 A1* | 12/2010 | Watari | ................. | C08L 67/02 359/883 |
| 2011/0230595 A1* | 9/2011 | Moulinie | ................. | C08L 67/02 523/451 |
| 2013/0267641 A1* | 10/2013 | Yamaguchi | ............... | C08K 5/13 524/323 |
| 2013/0302582 A1* | 11/2013 | Matsunaga | ............. | B32B 27/36 428/217 |

FOREIGN PATENT DOCUMENTS

| | | |
|---|---|---|
| CN | 101472991 A | 7/2009 |
| CN | 103710785 A | 4/2014 |
| JP | 11-101905 A | 4/1999 |
| JP | 2000-035509 A | 2/2000 |
| JP | 2004-240292 A | 8/2004 |
| JP | 2004-250636 A | 9/2004 |
| JP | 2005-041977 A | 2/2005 |
| JP | 2006-225440 A | 8/2006 |
| JP | 2008-280409 A | 11/2008 |
| JP | 2011-13353 A | 1/2011 |
| JP | 2011-133523 A | 7/2011 |
| JP | 2012-57152 A | 3/2012 |
| WO | WO-2012098967 A1 * | 7/2012 ............. B32B 27/36 |

OTHER PUBLICATIONS

International Search Report dated Jul. 28, 2015 in PCT/JP2015/068953 filed Jul. 1, 2015.
Combined Office Action and Search Report dated Jan. 17, 2018 in Chinese Patent Application No. 201580036112.5 (with English translation of the Office Action obtained through the one portal dossier and English translation of categories of cited documents), 16 pages.

* cited by examiner

*Primary Examiner* — Christopher M Rodd
(74) *Attorney, Agent, or Firm* — Oblon, McClelland, Maier & Neustadt, L.L.P.

(57) ABSTRACT

A polyester resin composition is provided that exhibits a low shrinkage ratio and excellent mold release properties while maintaining a high mechanical strength, that also provides excellent surface properties and an excellent appearance for a molded article and an excellent appearance when vapor deposited, and that resists the production of fogging even during high-temperature use. An injection molded article, a light-reflecting base body, and a light-reflecting body are also provided.

The polyester resin composition characteristically contains 0.1 to 20 mass parts of (B) an inorganic filler having an average primary particle diameter of not more than 2.5 μm, per 100 mass parts of (A) a resin component containing (A1) polybutylene terephthalate resin pellets and (A2) a polyester resin powder.

20 Claims, No Drawings

POLYESTER RESIN COMPOSITION, INJECTION MOLDED ARTICLE, LIGHT-REFLECTING BASE BODY, AND LIGHT-REFLECTING BODY

CROSS-REFERENCE TO RELATED APPLICATIONS

This application is a National Stage of PCT/JP2015/068953, which was filed on Jul. 1, 2015. This application is based upon and claims the benefit of priority to Japanese Application No. 2014-135831, which was filed on Jul. 1, 2014.

TECHNICAL FIELD

The present invention relates to a polyester resin composition, an injection molded article, a light-reflecting base body, and a light-reflecting body. The present invention particularly relates to a polyester resin composition that exhibits a low shrinkage ratio and excellent mold release properties while maintaining a high mechanical strength, that also provides excellent surface properties and an excellent appearance for a molded article and an excellent surface appearance by a vapor-deposited product, and that depresses the production of fogging even during high-temperature use, and to an injection molded article, a light-reflecting base body, and a light-reflecting body.

BACKGROUND ART

The interior and exterior trim components of vehicles such as automobiles must have a high strength and excellent appearance properties, and in addition are undergoing weight reduction by reducing thickness and miniaturizing, with the goals, inter alia, of cost reduction and resource savings. Thermoplastic polyester resins such as polybutylene terephthalate resins inherently have excellent mechanical properties, electrical properties, etc. and also an excellent chemical resistance, heat resistance, etc., and are therefore broadly used for a variety of components for vehicles such as automobiles. In addition, so-called fiber-reinforced polyester resins—which are obtained by blending a fibrous reinforcement, e.g., glass fiber, carbon fiber, and so forth, into a thermoplastic polyester resin—exhibit greatly enhanced mechanical properties and for this reason are also used as vehicle components (See PTL 1).

Among vehicle components, for example, lamp-related components, e.g., automotive headlamps and so forth, are components for which mechanical properties and appearance properties are particularly required; this includes the component known as a lamp extension, which is alongside the reflector and has a function of light concentration and reflection (See PTL 2). In order to concentrate and reflect light, the lamp extension has a metal, e.g., aluminum, vapor deposited on a thin-walled—generally about 2 mm—molded article that has a complex reflective structure.

Reinforced resins obtained by the incorporation of an inorganic filler, e.g., talc, mica, and so forth, in a polybutylene terephthalate resin exhibit an excellent heat resistance and appearance and as a result are widely used for these lamp component applications. In particular, the main stream for lamp extensions is to carry out aluminum vapor deposition after the primer treatment on the surface of a molded article of a reinforced polybutylene terephthalate resin. Reinforced polybutylene terephthalate resins generally have microscopic bumps and dents on the surface, and, when aluminum vapor deposition is performed directly on a molded article formed of a reinforced polybutylene terephthalate resin, light is diffusely reflected by these bumps and dents and a satisfactory reflective light-focusing effect is not obtained; as a result, treatment with a primer becomes a necessary step in order to use these molded articles.

However, the primer treatment step is directly connected to an increase of production costs and also limits the design freedom, and a primerless direct vapor deposition is thus desired. In general, smooth-surface unreinforced resins also offer the possibility of omitting the primer treatment, but they produce problems with, for example, the secondary shrinkage behavior, heat resistance, and shrinkage ratio. In particular, complex shapes have come to be required of lamp extensions in recent years, and mold release problems also frequently occur with unreinforced polybutylene terephthalate resins, which have high shrinkage ratios. In addition, unreinforced resins exhibit large shrinkage ratio differences from reinforced resins, and a problem that can also occur in the molding of unreinforced polybutylene terephthalate resin is that the mold used for the reinforced resin cannot be repurposed.

Thus, unreinforced polybutylene terephthalate resin materials present the possibility of direct vapor deposition, but also present the difficulty in handling with lamp extension-related applications that reflect recent trends.

At present, a high flowability is required of the resin composition due to the upsizing of automotive lamp components and a reduction in the number of components, and because of this methods are generally used in which the flowability is secured by raising the resin molding temperature.

However, gases (volatile component) are readily produced during molding with these methods. This volatile component causes the production of fogging-like appearance defects on the surface of the lamp component, and as a result good-quality lamp components cannot be continuously obtained and new countermeasures, e.g., polishing or wiping the mold, then become necessary. Moreover, the surface of the light-reflecting body is fogged due to deteriorating the surface of the metal thin film by exposing to high temperature atmospheres.

Given these circumstances, there is strong demand for a polybutylene terephthalate resin material that adapts direct vapor deposition, that has a low shrinkage ratio and excellent mold release properties and an excellent appearance, and that resists the production of fogging even during use at high temperatures.

CITATION LIST

Patent Literature

[PTL 1] Japanese Patent Application Laid-open No. 2008-280409
[PTL 2] Japanese Patent Application Laid-open No. 2006-225440

SUMMARY OF INVENTION

Technical Problem

The present inventor investigated the use of inorganic fillers having small particle diameters in order to obtain an excellent surface appearance, but found that inorganic fillers having small particle diameters readily undergo scattering and classification and that the presence in the molded article of their secondary aggregates causes the appearance defects, e.g., surface bumps and dents.

Under these circumstances, an object (problem) of the present invention is to provide a polyester resin composition that does not need a primer treatment, that exhibits a low shrinkage ratio and excellent mold release properties while maintaining a high mechanical strength, that also provides excellent surface properties and an excellent appearance and an excellent appearance when vapor deposited, and that resists the production of fogging even during high-temperature use.

Solution to Problem

As a result of intensive investigations in order to solve the problem identified above, the present inventor discovered that, for a resin material containing a specific amount of an inorganic filler that has a specific average particle diameter, this problem is solved by blending a polyester resin powder into polybutylene terephthalate resin pellets and a polyester resin material is thereby obtained that exhibits a low shrinkage ratio and excellent mold release properties while maintaining a high mechanical strength, that also provides excellent surface properties and an excellent appearance and an excellent appearance when vapor deposited, and that resists the production of fogging even during high-temperature use.

For another aspect of the present invention, the discovery was made that the problem for the present invention is solved by a polyester resin material that is a resin composition containing a specific amount of an inorganic filler having a specific average particle diameter and specific gravity, wherein the maximum roughness height Ry of a surface of a molded article obtained by the injection molding of this resin composition is not more than 5.5 μm. The present invention was achieved based on these discoveries.

The present invention provides the following polyester resin composition, injection molded article, light-reflecting base body, and light-reflecting body.

[1] A polyester resin composition containing 0.1 to 20 mass parts of (B) an inorganic filler that has an average primary particle diameter of not more than 2.5 μm, per 100 mass parts of (A) a resin component containing (A1) polybutylene terephthalate resin pellets and (A2) a polyester resin powder.

[2] The polyester resin composition according to the preceding [1], wherein a blend of the polyester resin powder (A2) and the inorganic filler (B) has a maximum sliding shear stress of not more than 8 N.

[3] The polyester resin composition according to the preceding [1] or [2], wherein the average primary particle diameter of the polyester resin powder (A2) is 1000- to 8000-times the average primary particle diameter of the inorganic filler (B).

[4] The polyester resin composition according to any one of the preceding [1] to [3], wherein the content of the polyester resin powder (A2) is 1 to 50 mass % in the resin component (A).

[5] The polyester resin composition according to any one of the preceding [1] to [4], wherein the average particle diameter of the polyester resin powder (A2) is 100 to 1,500 μm.

[6] The polyester resin composition according to any one of the preceding [1] to [5], wherein the ratio (A2):(B) between the contents of the polyester resin powder (A2) and the inorganic filler (B) is 30:70 to 95:5.

[7] The polyester resin composition according to any one of the preceding [1] to [6], wherein the polyester resin powder (A2) is a polybutylene terephthalate resin powder.

[8] The polyester resin composition according to any one of the preceding [1] to [7], wherein the inorganic filler (B) is at least one element selected from the group consisting of calcium carbonate, talc, mica, silica, kaolin, barium sulfate, and zirconium silicate.

[9] The polyester resin composition according to any one of the preceding [1] to [8], wherein the inorganic filler (B) is calcium carbonate.

[10] The polyester resin composition according to any one of the preceding [1] to [9], wherein the resin component (A) contains (A3) a polyethylene terephthalate resin and/or (A4) a styrenic resin and the content thereof in the resin component (A) is 1 to 40 mass %.

[11] The polyester resin composition according to any one of the preceding [1] to [10], further including, per 100 mass parts of the resin component (A), 0.001 to 2 mass parts of a mold releasing agent having an acid value of 10 to 40 mg KOH/g.

[12] The polyester resin composition according to any one of the preceding [1] to [11], further including, per 100 mass parts of the resin component (A), 0.001 to 1 mass part of a hindered phenol stabilizer that has a melting point of at least 150° C.

[13] An injection molded article obtained by injection molding of the polyester resin composition according to any one of the preceding [1] to [12].

[14] The injection molded article according to the preceding [13], which is a light-reflecting base body.

[15] A light-reflecting body having a light-reflecting layer disposed on the light-reflecting base body according to the preceding [14].

[16] The light-reflecting body according to the preceding [15], wherein the light-reflecting layer is formed of a metal thin film layer, and the metal thin film layer is in direct contact with a surface of the light-reflecting base body.

[17] A polyester resin composition containing 0.1 to 20 mass parts of (B) an inorganic filler that has an average primary particle diameter of not more than 2.5 μm and a specific gravity of not more than 3 g/cm$^3$, per 100 mass parts of (A) a resin component containing a polybutylene terephthalate resin, wherein a surface of a molded article obtained by injection molding of the polyester resin composition has a maximum roughness height Ry of not more than 5.5 μm.

[18] The polyester resin composition according to the preceding [17], wherein the surface of the molded article has an arithmetic average roughness Ra of not more than 0.25 μm.

[19] The polyester resin composition according to the preceding [17] or [18], wherein the molded article in which an aluminum layer with a thickness of 150 nm is disposed on a surface has a diffuse reflectance of less than 1% on the aluminum layer side.

Advantageous Effect of Invention

The polyester resin composition of the present invention exhibits a low shrinkage ratio and excellent mold release properties while maintaining a high mechanical strength; also provides excellent surface properties and an excellent appearance, and an excellent appearance when vapor deposited; and is resistant to the production of fogging even during high-temperature use. In particular, the injection molded article and light-reflecting base body obtained by injection molding the polyester resin composition of the present invention can be directly vapor deposited with aluminum without a primer treatment, and the light-reflecting body obtained by aluminum vapor deposition has a very good appearance and can be advantageously used, for example, for vehicular lamps, e.g., for automobiles, and in particular for lamp extensions.

DESCRIPTION OF EMBODIMENTS

Summary of Invention

The polyester resin composition of the first invention of the present invention characteristically contains 0.1 to 20 mass parts of (B) an inorganic filler that has an average primary particle diameter of not more than 2.5 µm, per 100 mass parts of (A) a resin component containing (A1) polybutylene terephthalate resin pellets and (A2) a polyester resin powder.

The polyester resin composition of the second invention of the present invention is a polyester resin composition that contains 0.1 to 20 mass parts of (B) an inorganic filler that has an average primary particle diameter of not more than 2.5 µm and a specific gravity of not more than 3 g/cm$^3$, per 100 mass parts of (A) a resin component containing a polybutylene terephthalate resin, and is characterized in that the maximum roughness height Ry of a surface of a molded article obtained by the injection molding of the polyester resin composition is not more than 5.5 µm.

Embodiments of the present invention are described in detail in the following. The description provided in the following is based on embodiments and specific examples, but the present invention should not be construed as being limited to or by these embodiments and specific examples.

In this Description, the numerical values given before and after a "to" are used in the sense of being included as lower limit and upper limit values.

[Polyester Resin Composition of the First Invention]

The polyester resin composition of the first invention of the present invention characteristically contains (A1) polybutylene terephthalate resin pellets and (A2) a polyester resin powder.

[Polybutylene Terephthalate Resin Pellets (A1)]

The polybutylene terephthalate resin used in the polybutylene terephthalate resin pellets (A1) is a polyester resin having a structure in which a terephthalic acid unit and a 1,4-butanediol unit are bonded through an ester bond and includes polybutylene terephthalate resins (homopolymers), polybutylene terephthalate copolymers containing an additional copolymerization component in addition to the terephthalic acid unit and the 1,4-butanediol unit, and mixtures of the homopolymer with such a copolymer.

The polybutylene terephthalate resin may contain a dicarboxylic acid unit other than terephthalic acid, and this additional dicarboxylic acid can be specifically exemplified by aromatic dicarboxylic acids such as isophthalic acid, orthophthalic acid, 1,5-naphthalenedicarboxylic acid, 2,5-naphthalenedicarboxylic acid, 2,6-naphthalenedicarboxylic acid, biphenyl-2,2'-dicarboxylic acid, biphenyl-3,3'-dicarboxylic acid, biphenyl-4,4'-dicarboxylic acid, bis(4,4'-carboxyphenyl)methane, anthracenedicarboxylic acid, and 4,4'-diphenyl ether dicarboxylic acid; alicyclic dicarboxylic acids such as 1,4-cyclohexanedicarboxylic acid and 4,4'-dicyclohexyldicarboxylic acid; and aliphatic dicarboxylic acids such as adipic acid, sebacic acid, azelaic acid, and dimer acid.

The diol unit may include an additional diol unit other than 1,4-butanediol, and this additional diol unit can be specifically exemplified by aliphatic and alicyclic diols that have 2 to 20 carbon atoms and by bisphenol derivatives. Specific examples are ethylene glycol, propylene glycol, 1,5-pentanediol, 1,6-hexanediol, neopentyl glycol, decamethylene glycol, cyclohexanedimethanol, 4,4'-dicyclohexylhydroxymethane, 4,4'-dicyclohexylhydroxypropane, and diols obtained by the addition of ethylene oxide to bisphenol A. Additional examples are triols such as glycerin and trimethylolpropane.

The polybutylene terephthalate resin is preferably a polybutylene terephthalate homopolymer obtained by the polycondensation of terephthalic acid and 1,4-butanediol, but may be a polybutylene terephthalate copolymer that contains one or more species of dicarboxylic acid other than terephthalic acid as the carboxylic acid unit and/or one or more species of diol other than 1,4-butanediol as the diol unit. Viewed in terms of the mechanical properties and heat resistance, the proportion of the terephthalic acid in the dicarboxylic acid unit in the polybutylene terephthalate resin is preferably at least 70 mol % and is more preferably at least 90 mol %. Similarly, the proportion of the 1,4-butanediol in the diol unit is preferably at least 70 mol % and more preferably at least 90 mol %.

In addition to the difunctional monomers indicated above, a trifunctional monomer, e.g., trimellitic acid, trimesic acid, pyromellitic acid, pentaerythritol, and trimethylolpropane, may also be used in small amounts in order to introduce crosslink structures, while a monofunctional compound, e.g., a fatty acid, may also be used in small amounts for molecular weight adjustment.

The polybutylene terephthalate resin can be produced by the melt polymerization in a batch or continuous mode from a diol component in which the major component is 1,4-butanediol and a dicarboxylic acid component in which the major component is terephthalic acid, or an ester derivative thereof. In addition, after a low molecular weight polybutylene terephthalate resin has been produced by melt polymerization, the degree of polymerization (or molecular weight) can be raised to a desired value by an additional solid-phase polymerization under a nitrogen atmosphere or under reduced pressure.

The polybutylene terephthalate resin is preferably a polybutylene terephthalate resin obtained by a production method in which melt polycondensation is carried out in a continuous mode between a dicarboxylic acid component in which the major component is terephthalic acid and a diol component in which the major component is 1,4-butanediol.

The catalyst used during the execution of the esterification reaction may be a heretofore known catalyst and can be exemplified by titanium compounds, tin compounds, magnesium compounds, and calcium compounds. Titanium compounds are particularly favorable thereamong. Specific examples of titanium compounds for use as the esterification catalyst are, for example, titanium alcoholates such as tetramethyl titanate, tetraisopropyl titanate, and tetrabutyl titanate and titanium phenolates such as tetraphenyl titanate.

The polybutylene terephthalate resin may also be a polybutylene terephthalate resin that has been modified by copolymerization, and specific preferred copolymers here are polyester ether resins in which a polyalkylene glycol (particularly polytetramethylene glycol (PTMG)) has been copolymerized, polybutylene terephthalate resins in which a dimer acid has been copolymerized, and particularly polybutylene terephthalate resins in which isophthalic acid has been copolymerized.

When a polyester ether resin obtained by the copolymerization of a polyalkylene glycol is used as the modified polybutylene terephthalate resin, the proportion of the polyalkylene glycol component in the copolymer is preferably 3 to 40 mass %, more preferably 5 to 30 mass %, and even more preferably 10 to 25 mass %. A tendency for there to be an excellent balance between the mechanical properties and heat resistance is brought about by the use of such a copolymerization proportion, which is thus preferred.

When a polybutylene terephthalate resin obtained by the copolymerization of a dimer acid is used as the modified polybutylene terephthalate resin, the proportion of the dimer acid component in the total carboxylic acid component is, as the carboxylic acid group, preferably 0.5 to 30 mol %, more preferably 1 to 20 mol %, and even more preferably 3 to 15 mol %. A tendency for there to be an excellent balance among the mechanical properties, the long-term heat resistance, and the toughness is brought about by the use of such a copolymerization proportion, which is thus preferred.

When a polybutylene terephthalate resin obtained by the copolymerization of isophthalic acid is used as the modified polybutylene terephthalate resin, the proportion of the isophthalic acid component in the total carboxylic acid component is, as the carboxylic acid group, preferably 1 to 30 mol %, more preferably 1 to 20 mol %, and even more preferably 3 to 15 mol %. A tendency for there to be an excellent balance among the mechanical properties, the heat resistance, the injection moldability, and the toughness is brought about by the use of such a copolymerization proportion, which is thus preferred.

Among these modified polybutylene terephthalate resins, polyester ether resins in which a polytetramethylene glycol is copolymerized and polybutylene terephthalate resins in which isophthalic acid is copolymerized are preferred.

The content of such a copolymer, in 100 mass % for the total amount of the polybutylene terephthalate resin, is preferably 5 to 50 mass %, more preferably 10 to 40 mass %, and particularly preferably 15 to 30 mass %.

The intrinsic viscosity ($[\eta]$) of the polybutylene terephthalate resin is preferably at least 0.6 dl/g, more preferably at least 0.7 dl/g, and even more preferably at least 0.75 dl/g. When the intrinsic viscosity is lower than 0.6 dl/g, the resulting resin composition readily assumes a low mechanical strength, e.g., impact resistance. In addition, the intrinsic viscosity is preferably not more than 1.8 dl/g, more preferably not more than 1.6 dl/g, and even more preferably not more than 1.3 dl/g. At greater than 1.8 dl/g, the resin composition takes on a poor flowability and the moldability is impaired and due to this the surface properties of the obtained molded article may become unsatisfactory for use as a light-reflecting body. This intrinsic viscosity is measured at 30° C. in a mixed solvent of tetrachloroethane and phenol at 1:1 (mass ratio).

The amount of terminal carboxyl group in the polybutylene terephthalate resin may be determined by selection as appropriate, but is generally not more than 60 eq/ton and is preferably not more than 50 eq/ton and is more preferably not more than 30 eq/ton. The gas production during melt molding of the resin composition is facilitated at above 50 eq/ton. While the lower limit on the amount of terminal carboxyl group is not particularly specified, it is generally 10 eq/ton based on a consideration of the productivity in polybutylene terephthalate resin production.

The amount of terminal carboxyl group in the polybutylene terephthalate resin refers to the value obtained by dissolving 0.5 g of the polybutylene terephthalate resin in 25 mL of benzyl alcohol and measuring by titration with a 0.01 mol/l benzyl alcohol solution of sodium hydroxide. The amount of terminal carboxyl group may be adjusted using any heretofore known method, for example, methods that use adjustments in the polymerization conditions, e.g., the charge ratio for the starting materials for polymerization, the polymerization temperature, the pressure reduction method, and so forth, and methods that use the reaction of a terminating agent.

[Method of Producing the Polybutylene Terephthalate Resin Pellets (A1)]

There are no particular limitations on the method of producing the polybutylene terephthalate resin pellets (A1) used in the present invention, and any heretofore known method may be used. A specific example is a method in which, using the usual procedures, the polybutylene terephthalate resin residing in a molten state after polymerization is melt kneaded with a single-screw or twin-screw extruder and is extruded into a strand, which is cooled by, e.g., water cooling or air cooling, and is then cut.

With regard to pellet size, generally the pellet length exceeds 1 mm and is preferably at least 1.5 mm and more preferably at least 2 mm and is generally not more than 10 mm, preferably not more than 7 mm, and more preferably not more than 5 mm. In addition, are no particular limitations on its shape, which can be, for example, cylindrical, prismatic, platy, spherical, ellipsoidal, and so forth, wherein cylindrical and elliptical columnar shapes are preferred.

[Polyester Resin Powder (A2)]

The polyester resin used for the polyester resin powder (A2) should be a thermoplastic polyester resin, but is not otherwise particularly limited. This is generally a thermoplastic polyester resin obtained by, for example, the polycondensation of a dicarboxylic acid compound with a dihydroxy compound, the polycondensation of an oxycarboxylic acid compound, or the polycondensation of their compounds, and may be either a homopolyester or a copolyester.

An aromatic dicarboxylic acid or ester-forming derivative thereof is preferably used for the dicarboxylic acid compound constituting the polyester resin.

The aromatic dicarboxylic acid can be exemplified by terephthalic acid, isophthalic acid, orthophthalic acid, 1,5-naphthalenedicarboxylic acid, 2,5-naphthalenedicarboxylic acid, 2,6-naphthalenedicarboxylic acid, biphenyl-2,2'-dicarboxylic acid, biphenyl-3,3'-dicarboxylic acid, biphenyl-4,4'-dicarboxylic acid, diphenyl ether 4,4'-dicarboxylic acid, diphenylmethane-4,4'-dicarboxylic acid, diphenylsulfone-4,4'-dicarboxylic acid, diphenylisopropylidene-4,4'-dicarboxylic acid, 1,2-bis(phenoxy)ethane-4,4'-dicarboxylic acid, anthracene-2,5-dicarboxylic acid, anthracene-2,6-dicarboxylic acid, p-terphenylene-4,4'-dicarboxylic acid, and pyridine-2,5-dicarboxylic acid, wherein the use of terephthalic acid is preferred.

A mixture of two or more of these aromatic dicarboxylic acids may be used. As is known, besides the free acid form, these can be used in the polycondensation reaction in the form of ester-forming derivatives, e.g., the dimethyl ester.

As long as a small amount is used, one or more of the following may be used mixed with these aromatic dicarboxylic acids: an aliphatic dicarboxylic acid such as adipic acid, azelaic acid, dodecanedioic acid, sebacic acid, and so forth, and/or an alicyclic dicarboxylic acid such as 1,2-cyclohexanedicarboxylic acid, 1,3-cyclohexanedicarboxylic acid, 1,4-cyclohexanedicarboxylic acid, and so forth.

The dihydroxy compound constituting the polyester resin can be exemplified by aliphatic diols such as ethylene glycol, propylene glycol, butanediol, hexylene glycol, neopentyl glycol, 2-methylpropane-1,3-diol, diethylene glycol, and triethylene glycol; alicyclic diols such as cyclohexane-1,4-dimethanol; and mixtures of the preceding. As long as a small amount is used, one or more long-chain diols having a molecular weight of 400 to 6,000, i.e., polyethylene glycol, poly-1,3-propylene glycol, polytetramethylene glycol, and so forth, may also be copolymerized.

An aromatic diol such as hydroquinone, resorcinol, naphthalenediol, dihydroxydiphenyl ether, 2,2-bis(4-hydroxyphenyl)propane, and so forth may also be used.

In addition to the difunctional monomers indicated above, a trifunctional monomer, e.g., trimellitic acid, trimesic acid, pyromellitic acid, pentaerythritol, and trimethylolpropane, may also be used in small amounts in order to introduce crosslink structures, while a monofunctional compound, e.g., a fatty acid, may also be used in small amounts for molecular weight adjustment.

A polyester resin composed mainly of a dicarboxylic acid/diol polycondensate, i.e., a polyester resin in which at least 50 mass % and preferably at least 70 mass % of the total resin is formed of such a polycondensate, is generally used as the polyester resin. An aromatic carboxylic acid is preferred for the dicarboxylic acid and an aliphatic diol is preferred for the diol.

Preferred among the preceding are polyalkylene terephthalates in which at least 95 mol % of the acid component is terephthalic acid and at least 95 mass % of the alcohol component is an aliphatic diol. Representative examples here are polybutylene terephthalate and polyethylene terephthalate. These are preferably close to being homopolyesters, i.e., at least 95 mass % of the total resin is formed of the terephthalic acid component and the 1,4-butanediol or ethylene glycol component.

The intrinsic viscosity of the polyester resin is preferably 0.5 to 2 dl/g. Polyester resin having an intrinsic viscosity in the range from 0.6 to 1.5 dl/g is more preferred from the standpoint of the moldability and mechanical properties. The use of a polyester resin having an intrinsic viscosity lower than 0.5 dl/g facilitates the resulting resin composition having a low mechanical strength. At above 2 dl/g, the resin composition takes on a poor flowability and the moldability may be impaired.

The intrinsic viscosity of the polyester resin is the value measured at 30° C. in a mixed solvent of tetrachloroethane and phenol at 1:1 (mass ratio).

The amount of terminal carboxyl group in the polyester resin may be determined by selection as appropriate, but is generally not more than 60 eq/ton and is preferably not more than 50 eq/ton and is more preferably not more than 30 eq/ton. The production of gas during melt molding of the resin composition is facilitated at above 50 eq/ton. While the lower limit on the amount of terminal carboxyl group is not particularly specified, it is generally 10 eq/ton.

The amount of terminal carboxyl group in the polyester resin is the value measured by dissolving 0.5 g of the polyester resin in 25 mL of benzyl alcohol and titrating with a 0.01 mol/l benzyl alcohol solution of sodium hydroxide. The amount of terminal carboxyl group may be adjusted using any heretofore known method, for example, methods that use adjustments in the polymerization conditions, e.g., the charge ratio for the starting materials for polymerization, the polymerization temperature, the pressure reduction method, and so forth, and methods that use the reaction of a terminating agent.

Among the preceding, the polyester resin used in the polyester resin powder (A2) preferably contains a polybutylene terephthalate resin or a polyethylene terephthalate resin, and more preferably at least 50 mass %, even more preferably at least 70 mass %, and particularly preferably at least 90 mass % of the polyester resin is a polybutylene terephthalate resin or a polyethylene terephthalate resin and most preferably the entire amount of the polyester resin is a polybutylene terephthalate resin or a polyethylene terephthalate resin. Viewed from the perspective of being able to satisfy all the required properties of a lamp extension in a well balanced manner, the entire amount of the polyester resin is preferably a polybutylene terephthalate resin in the present invention.

The same polybutylene terephthalate resins as used for the previously described polybutylene terephthalate resin pellets (A1) can be used as the polybutylene terephthalate resin here, and the preferred polybutylene terephthalate resins here are also as described above.

The polyethylene terephthalate resin is a resin in which, with reference to the total constituent repeat units, the main constituent unit is the oxyethyleneoxyterephthaloyl unit from terephthalic acid and ethylene glycol, and may contain constituent repeat units other than the oxyethyleneoxyterephthaloyl unit. The polyethylene terephthalate resin is produced using ethylene glycol and terephthalic acid or a lower alkyl ester thereof as the main starting materials, but other acid components and/or other glycol components may also be used as additional starting materials.

The acid component other than terephthalic acid can be exemplified by dicarboxylic acids, e.g., phthalic acid, isophthalic acid, naphthalenedicarboxylic acid, 4,4'-diphenylsulfone dicarboxylic acid, 4,4'-biphenyldicarboxylic acid, 1,4-cyclohexanedicarboxylic acid, 1,3-phenylenedioxydiacetic acid and its structural isomers, malonic acid, succinic acid, and adipic acid, and derivatives thereof, and by oxyacids, e.g., p-hydroxybenzoic acid and glycolic acid, and derivatives thereof.

The diol component other than ethylene glycol can be exemplified by aliphatic glycols such as 1,2-propanediol, 1,3-propanediol, 1,4-butanediol, pentamethylene glycol, hexamethylene glycol, and neopentyl glycol; alicyclic glycols such as cyclohexanedimethanol; and aromatic dihydroxy compound derivatives such as bisphenol A and bisphenol S.

The polyethylene terephthalate resin may be a polyethylene terephthalate resin in which not more than 1.0 mol %, preferably not more than 0.5 mol %, and even more preferably not more than 0.3 mol % of a crosslinking component has been copolymerized, for example, an acid having a trifunctional ester-forming capacity such as tricarballylic acid, trimesic acid, and trimellitic acid or a tetrafunctional ester-forming capacity such as pyromellitic acid or an alcohol having a trifunctional or a tetrafunctional ester-forming capacity such as glycerin, trimethylolpropane, and pentaerythritol.

The intrinsic viscosity of the polyethylene terephthalate resin may be determined by selection as appropriate, but is generally 0.5 to 2 dl/g and is preferably 0.6 to 1.5 dl/g and is particularly preferably 0.7 to 1.0 dl/g. An improving trend is brought about for the mechanical characteristics, moldability, residence heat stability, chemical resistance, and wet heat resistance of the resin composition of the present invention by having the intrinsic viscosity be at least 0.5 dl/g and particularly at least 0.7 dl/g, which is thus preferred. In contrast, a trend of an increasing flowability for the resin composition is brought about by having the intrinsic viscosity be less than 2 dl/g and particularly less than 1.0 dl/g, which is thus preferred.

The intrinsic viscosity of the polyethylene terephthalate resin is the value measured at 30° C. in a mixed solvent of tetrachloroethane and phenol at 1:1 (mass ratio).

The amount of terminal carboxyl group in the polyethylene terephthalate resin may be determined by selection as appropriate, but is generally not more than 60 eq/ton and is preferably not more than 50 eq/ton and is more preferably not more than 30 eq/ton. The gas production during melt molding of the resin composition is facilitated at above 50 eq/ton. While the lower limit on the amount of terminal carboxyl group is not particularly specified, it is generally 10 eq/ton based on a consideration of the productivity during production of the polyethylene terephthalate resin.

The concentration of terminal carboxyl group in the polyethylene terephthalate resin is the value determined by dissolving 0.5 g of the polyethylene terephthalate resin in 25 mL of benzyl alcohol and titrating using a 0.01 mol/l benzyl alcohol solution of sodium hydroxide.

The amount of terminal carboxyl group may be adjusted using any heretofore known method, for example, methods that use adjustments in the polymerization conditions, e.g., the charge ratio for the starting materials for polymerization, the polymerization temperature, the pressure reduction method, and so forth, and methods that use the reaction of a terminating agent.

[Method of Producing the Polyester Resin Powder (A2)]

The polyester resin powder (A2) in the polyester resin composition of the first invention is the powder form of the polyester resin. The polyester resin may be polymerized into powder form by an interfacial polymerization method or a solution polymerization method or production may be carried out by the pulverization of polyester resin pellets; however, considered in terms of the ease of control of the particle diameter, the pulverization method of polyester resin pellet is preferably used.

The pellet pulverization means may be a multistage system in which the pellets are coarsely pulverized and then finely pulverized or may be a system that uses a single stage to achieve microfine-sizing; however, there are no limitations on the system here. Specific pulverization means can be exemplified by pulverization means that use, for example, a hammer mill, Turbo mill, jet mill, pin mill, centrifugal mill, Rotoplex, pulverizer, wet pulverization, chopper mill, Ultra Rotor, and so forth, and a normal temperature or cold pulverization system can be used. When these pulverization systems are used, a system designed to prevent temperature increases is useful, and in specific terms means using, e.g., a pulverizer (Herbold Meckesheim GmbH (Germany)), an Ultra Rotor (Altenberger Maschinen Jaeckering GmbH (Germany)), and so forth, are useful.

The polyester resin powder in the present invention denotes a polyester resin powder that has an average particle diameter of not more than 1,500 µm. 50 to 1,300 µm is preferred for the average particle diameter of the polyester resin powder (A2). At below 50 µm, a trend is assumed wherein the occurrence of production problems, for example, blocking in the resin composition production step, is facilitated. In addition, when the average particle diameter is too large, the effects of the present invention may not be obtained, for example, the appearance tends to be poor. The average particle diameter of the polyester resin powder (A2) is more preferably at least 100 µm, even more preferably at least 300 µm, still more preferably at least 500 µm, and particularly preferably at least 700 µm, and is more preferably not more than 1,200 µm, even more preferably not more than 1,100 µm, and particularly preferably not more than 1,000 µm.

Here, the average particle diameter of the polyester resin powder (A2) refers to the median diameter (D50) determined from the particle size distribution diagram obtained using a laser diffraction/scattering particle size distribution analyzer.

The bulk density of the polyester resin powder (A2) is preferably 0.2 to 0.8 $g/cm^3$ and is more preferably 0.3 to 0.7 $g/cm^3$ and is even more preferably 0.4 to 0.6 $g/cm^3$. The use of a polyester resin powder (A2) having such a bulk density is preferred because this facilitates the suppression of scattering and classification of the inorganic filler (B) during production of the resin composition and inhibits the occurrence of a poor appearance caused by the secondary aggregation of the inorganic filler (B). Here, the bulk density denotes the value measured by the method described in JIS K 7365.

[Content of the Polyester Resin Powder (A2) in the Resin Component (A)]

A characteristic feature of the polyester resin composition of the first invention is the co-use of the polyester resin powder (A2) with the polybutylene terephthalate resin pellets (A1). It is thought that, by doing this, mixing in the co-presence of the resin powder (A2) is made superior to mixing with the inorganic filler (B) in the presence of only the resin pellets (A1) and the secondary aggregation of the inorganic filler (B) is then suppressed and a uniform dispersion is achieved and a molded article exhibiting an excellent appearance and surface properties is thus obtained while maintaining a high mechanical strength.

The content of the polyester resin powder (A2) in the resin component (A) containing the polybutylene terephthalate resin pellets (A1) and the polyester resin powder (A2) is preferably 1 to 50 mass %, more preferably at least 3 mass %, even more preferably at least 5 mass %, and particularly preferably at least 7 mass % and is preferably not more than 45 mass %, more preferably not more than 40 mass %, particularly preferably not more than 30 mass %, and most preferably not more than 20 mass %.

By having the powder content be as described above, secondary aggregation of the inorganic filler (B) is suppressed and a uniform dispersion is achieved, a molded article with excellent surface properties and an excellent appearance is then readily obtained while a high mechanical strength is maintained, and in addition a resin composition also having excellent moisture absorption properties and hydrolysis properties is readily obtained, and the indicated powder content is thus preferred.

[Inorganic Filler (B)]

The polyester resin composition of the first invention of the present invention contains an inorganic filler (B) that has an average primary particle diameter of not more than 2.5 µm.

The inorganic filler (B) can be specifically exemplified by calcium carbonate, talc, mica, silica, kaolin, barium sulfate, zirconium silicate, clay, hydrotalcite, calcium sulfate, barium carbonate, magnesium carbonate, magnesium sulfate, calcium silicate, zinc oxide, magnesium oxide, calcium titanate, magnesium titanate, and barium titanate, wherein calcium carbonate, talc, mica, silica, kaolin, barium sulfate, and zirconium silicate are preferred; calcium carbonate and talc are more preferred; and calcium carbonate is particularly preferred.

A single inorganic filler (B) may be used by itself or two or more may be used in any proportions therebetween or thereamong. The inorganic filler (B) may be subjected to a surface treatment as necessary.

The average primary particle diameter of the inorganic filler (B) is not more than 2.5 µm: when 2.5 µm is exceeded, the surface smoothness of the molded article declines and a poor appearance is obtained when the vapor deposition of a metal, e.g., aluminum, is directly executed on the surface. The average primary particle diameter is preferably not more than 2 µm, more preferably not more than 1 µm, even more preferably not more than 0.5 µm, and particularly preferably not more than 0.4 µm. The lower limit is generally 0.01 µm and is preferably 0.05 µm, more preferably 0.08 µm, and particularly preferably 0.1 µm.

The average primary particle diameter of the inorganic filler (B) in the present invention refers to the D50 measured with a laser diffraction particle size distribution analyzer and specifically as measured using an "SALD-2100 laser diffraction particle size distribution analyzer" from Shimadzu Corporation.

The specific gravity of the inorganic filler (B) is preferably not more than 4 g/cm$^3$, more preferably not more than 3.5 g/cm$^3$, and even more preferably not more than 3 g/cm$^3$. The incorporation of an inorganic filler (B) having such a specific gravity causes the improvement in the appearance of the molded article due to the use of the polyester resin powder (A2) to be more significant. The specific gravity of the inorganic filler (B) denotes the value measured using a true specific gravity instrument based on the helium gas displacement method.

A surface treatment is also preferably executed on the inorganic filler (B) in order to improve its affinity for the resin. The surface-treatment agent can be exemplified by at least one element selected from alcohols such as trimethylolethane, trimethylolpropane, and pentaerythritol; alkanolamines such as triethylamine; higher fatty acids such as stearic acid; metal salts of fatty acids, e.g., calcium stearate and magnesium stearate; hydrocarbon lubricants such as polyethylene wax and liquid paraffin; basic amino acids such as lysine and arginine; polyglycerins and their derivatives; and coupling agents such as silane coupling agents, titanate coupling agents, and aluminum coupling agents.

Calcium carbonate, which is most preferably used as the inorganic filler (B) of the present invention, can be exemplified by synthetic calcium carbonate, natural calcium carbonate, and surface-treated calcium carbonate obtained by subjecting the preceding to surface treatment with, e.g., silicic acid or an organic acid.

The synthetic calcium carbonate can be produced, for example, by reacting calcium hydroxide with carbon dioxide. The calcium hydroxide can be produced, for example, by reacting calcium oxide with water. The calcium oxide can be produced by the calcination of limestone ore using, for example, coke. Since in this case carbon dioxide is produced during the calcination, calcium carbonate can be produced by the reaction of this carbon dioxide with calcium hydroxide.

The natural calcium carbonate is obtained by the pulverization using a known method of a calcium carbonate ore, e.g., naturally produced limestone and so forth. The method of pulverizing the calcium carbonate ore can be exemplified by methods that carry out pulverization using, for example, a roller mill, high-speed rotating mill (impact shear mill), driven container media mill (ball mill), media stirring mill, planetary ball mill, jet mill, and so forth.

The average primary particle diameter of the calcium carbonate is not more than 2.5 µm, and 0.01 to 2 µm is preferred, 0.05 to 1 µm is more preferred, 0.08 to 0.5 µm is still more preferred, and 0.1 to 0.4 µm is particularly preferred. The use of calcium carbonate having such an average primary particle diameter is preferred because this inhibits the occurrence of aggregation of the calcium carbonate and also supports an excellent diffuse reflectance after aluminum vapor deposition.

The silicic acid used for the surface treatment of the calcium carbonate should be able to attach silica to the surface of the calcium carbonate, but is not otherwise particularly limited. The silicic acids can be exemplified by alkali metal silicates such as sodium silicate and potassium silicate.

With the silicic acids, for example, an alkali silicate can be made into a silica hydrosol and this can be used for the surface treatment. The silica hydrosol can be produced using a known method. For example, a silica hydrosol can be produced from sodium silicate by an acid decomposition method. The acid decomposition method can be exemplified by a method in which an amorphous silica hydrosol is produced by the addition to an aqueous sodium silicate solution of, for example, an inorganic acid, e.g., hydrochloric acid or sulfuric acid, an organic acid, e.g., acetic acid or acrylic acid, or an acidic substance, e.g., aluminum sulfate or carbon dioxide. Production can also be carried out by a dialysis method, in which a silica hydrosol is produced by passing sodium silicate through a semipermeable membrane. A silica hydrosol can also be produced by an ion-exchange method using an ion-exchange resin.

The organic acid used for the surface treatment of the calcium carbonate can be exemplified by fatty acids, resin acids, lignins, and derivatives thereof. A mixture of two or more organic acids may be used.

The fatty acid can be exemplified by saturated or unsaturated fatty acids having 6 to 24 carbons. The number of carbons in the fatty acid is preferably 10 to 20. Saturated or unsaturated fatty acids having 6 to 24 carbons can be specifically exemplified by stearic acid, palmitic acid, lauric acid, behenic acid, oleic acid, erucic acid, and linoleic acid. Stearic acid, palmitic acid, lauric acid, and oleic acid are particularly preferred.

The fatty acid derivatives can be exemplified by the salts of fatty acids, the esters of fatty acids, and so forth. The fatty acid salts can be exemplified by the alkali metal salts, e.g., the sodium salt, potassium salt, and so forth, of the aforementioned saturated or unsaturated fatty acids having 6 to 24 carbons. The number of carbons in the fatty acid salt is preferably 10 to 20.

The fatty acid esters can be exemplified by the esters composed with a saturated aliphatic alcohol having 6 to 18 carbons and a saturated or unsaturated fatty acid having 6 to 24 carbons. The number of carbons in the fatty acid ester is preferably 10 to 20. The number of carbons in the saturated aliphatic alcohol is preferably 10 to 18.

The content of the inorganic filler (B) is 0.1 to 20 mass parts per 100 mass parts of the resin component (A) containing the polybutylene terephthalate resin pellets (A1) and the polyester resin powder (A2). When this content is less than 0.1 mass parts, the heat resistance is unsatisfactory and the shrinkage ratio is not adequately lowered. Conversely, when the content is more than 20 mass parts, an excellent appearance is not obtained due to the increase of aggregates originating from the inorganic filler. The content of the inorganic filler (B), expressed per 100 mass parts of the resin component (A) containing (A1) and (A2), is preferably at least 1 mass part, more preferably at least 2 mass parts, and even more preferably at least 2.5 mass parts and is preferably not more than 15 mass parts, more preferably not more than 10 mass parts, and particularly preferably not more than 7 mass parts.

For the polyester resin composition of the first invention, the maximum sliding shear stress of the blend of the polyester resin powder (A2) and the inorganic filler (B) is preferably not more than 10 N, more preferably not more than 8 N, even more preferably not more than 6 N, particularly preferably not more than 5 N, and most preferably not more than 4 N. Having the blend of the polyester resin powder (A2) and the inorganic filler (B) exhibit such a maximum sliding shear stress is preferred because this effectively improves upon the problem of the poor appearance caused by secondary aggregation of the inorganic filler (B) and supports a stable feed during production of the resin composition, e.g., during melt kneading.

The maximum sliding shear stress can be adjusted, for example, by an appropriate adjustment of the blending proportions for the polyester resin powder (A2) and the inorganic filler (B) based on considerations such as, for example, the average particle diameter of the polyester resin powder (A2) and the average primary particle diameter, specific gravity, shape, and method of surface treatment for the inorganic filler (B).

For the maximum sliding shear stress, a prescribed orthogonal loading stress is applied for a predetermined period of time to a mixture of the polyester resin powder (A2) and the inorganic filler (B) and is subsequently released, and the maximum sliding shear stress then denotes the value of the maximum stress required to slide this powder mixture at a constant rate. The maximum sliding shear stress can be measured using the conditions indicated in the examples described infra.

The average particle diameter of the polyester resin powder (A2) is also preferably 1,000- to 8,000-times the average primary particle diameter of the inorganic filler (B). The use of a combination of the inorganic filler (B) with the polyester resin powder (A2) having such an average particle diameter is preferred because this effectively improves upon the problem of the poor appearance caused by secondary aggregation of the inorganic filler (B) and supports a stable feed during production of the resin composition, e.g., during melt kneading. The average particle diameter of the polyester resin powder (A2) is more preferably 2,000- to 7,000-times, even more preferably 3,000- to 6,500-times, and particularly preferably 4,000- to 6,000-times the average primary particle diameter of the inorganic filler (B).

The mass ratio (A2):(B) between the contents of the polyester resin powder (A2) and the inorganic filler (B) in the present invention is preferably 30:70 to 95:5, more preferably 40:60 to 93:7, and even more preferably 50:50 to 90:10. The use of such content proportions is preferred because this provides an excellent state of dispersion for the inorganic filler and supports a stable feed during production of the resin composition, e.g., during melt kneading.

[Polyethylene Terephthalate Resin (A3)]

The resin component (A) in the present invention preferably contains a polyethylene terephthalate resin (A3) because this can bring about additional improvements in the surface appearance characteristics, e.g., the gloss and so forth. The polyethylene terephthalate resin (A3) may be blended as the previously described polyester resin powder (A2) or, for example, may be blended as pellets in addition to the powder. Viewed from the standpoint of the moisture absorption properties and hydrolysis properties, the blending of the pellet form is preferred.

The same polyethylene terephthalate resins as used for the polyester resin powder (A2) can be used for the polyethylene terephthalate resin (A3), and the preferred polyethylene terephthalate resins are also as indicated above.

The content of the polyethylene terephthalate resin (A3) in the resin component (A) is preferably 1 to 40 mass %, more preferably 5 to 35 mass %, even more preferably 8 to 30 mass %, and particularly preferably 10 to 25 mass % in the resin component (A). The surface smoothness tends to be unsatisfactory when the content is less than 1 mass %. It is disadvantageous for the content to exceed 40 mass % because crystallization and solidification are then slow, which can cause a lengthening of the cooling time and a poor mold release. Hereupon, when a polyethylene terephthalate resin powder is used as the polyester resin powder (A2), the content of the polyethylene terephthalate resin (A3) component is the total content of the polyethylene terephthalate resin powder and the polyethylene terephthalate resin (A3).

[Styrenic Resin (A4)]

The resin component (A) in the present invention preferably additionally contains a styrenic resin (A4) because this can reduce the shrinkage ratio and bring about an additional suppression of appearance defects, e.g., hesitation and so forth.

The styrenic resin can be exemplified by polymers obtained by the polymerization of styrenic monomer, copolymers of styrenic monomer and monomer copolymerizable with styrenic monomer, styrenic resins containing a graft copolymer obtained by the polymerization of at least a styrenic monomer in the presence of a rubber, and graft copolymers obtained by the polymerization, in the presence of a rubber, of at least a styrenic monomer and a monomer copolymerizable with styrenic monomer. The monomer copolymerizable with styrenic monomer can be exemplified by (meth)acrylonitrile and alkyl (meth)acrylate esters.

The styrenic resin can be exemplified by copolymers or styrene and (meth)acrylonitrile; copolymers of styrene, (meth)acrylonitrile, and an additional copolymerizable monomer; graft copolymers obtained by the graft polymerization of styrenic monomer and (meth)acrylonitrile in the presence of a rubber; and styrenic graft copolymers obtained by the polymerization of, e.g., styrene and so forth, in the presence of a rubber component. Preferred specific examples are AS resins, HIPS resins, ABS resins, AES resins, and AAS resins, wherein AS resins are particularly preferred.

The method of producing the styrenic copolymers can be exemplified by known methods, e.g., emulsion polymerization methods, solution polymerization methods, suspension polymerization methods, and bulk polymerization methods.

Preferred examples of styrene/(meth)acrylonitrile copolymers are graft copolymers obtained by the graft polymerization of at least a styrenic monomer and (meth)acrylonitrile in the presence of a rubber, and styrene/(meth)acrylonitrile copolymers formed of a copolymer obtained by the polymerization of at least a styrenic monomer and (meth)acrylonitrile and a graft copolymer obtained by the polymerization of at least a styrenic monomer and (meth)acrylonitrile in the presence of a rubber.

The styrenic monomer can be exemplified by styrene, α-methylstyrene, p-methylstyrene, and so forth, wherein styrene is preferred. Monomer copolymerizable with styrenic monomer can be exemplified by alkyl (meth)acrylate esters such as methyl acrylate, ethyl acrylate, propyl acrylate, methyl methacrylate, and ethyl methacrylate, maleimide, and N-phenylmaleimide, and so forth, wherein alkyl (meth)acrylate esters are preferred. Monomer copolymerizable with styrenic monomer and (meth)acrylonitrile can be exemplified by alkyl (meth)acrylate esters such as methyl acrylate, ethyl acrylate, propyl acrylate, methyl methacrylate, and ethyl methacrylate, maleimide, and N-phenylmaleimide, and so forth, wherein alkyl (meth)acrylate esters are preferred.

The rubber is preferably a rubber having a glass transition temperature of equal to or less than 10° C. The rubber can be specifically exemplified by diene rubbers, acrylic rubbers, ethylene/propylene rubbers, and silicone rubbers, with diene rubbers and acrylic rubbers being preferred. The diene rubbers can be exemplified by polybutadiene, butadiene/styrene copolymers, polyisoprene, butadiene/lower alkyl (meth)acrylate ester copolymers, and butadiene/styrene/lower alkyl (meth)acrylate ester copolymers. The lower alkyl (meth)acrylate ester can be exemplified by methyl acrylate, ethyl acrylate, methyl methacrylate, and ethyl methacrylate. The proportion of the lower alkyl (meth)acrylate ester in the butadiene/lower alkyl (meth)acrylate ester copolymer or butadiene/styrene/lower alkyl (meth)acrylate ester copolymer is preferably not more than 30 mass % of the mass of the rubber.

The acrylic rubber can be exemplified by alkyl acrylate rubbers wherein the number of carbons in the alkyl group is preferably 1 to 8. Specific examples of alkyl acrylate rubbers are rubbers derived from ethyl acrylate, butyl acrylate, and ethylhexyl acrylate. A crosslinkable ethylenically unsaturated monomer may optionally be used in the alkyl acrylate rubber, and this crosslinking agent can be exemplified by alkylenediols, di(meth)acrylates, polyester di(meth)acrylates, divinylbenzene, trivinylbenzene, triallyl cyanurate, allyl (meth)acrylate, butadiene, and isoprene. Another example of the acrylic rubbers is a core-shell polymer having a crosslinked diene rubber as the core.

Surprisingly, even when a powder of the styrenic resin (A4) is used in the polyester resin composition of the first invention of the present invention, the appearance-improving effect as described above with maintenance of the mechanical strength and/or heat-resistant characteristics of the aluminum vapor-deposited side, is not observed. The reason for this is not clear, but it was established for the first time in investigations by the present inventor that this appearance-improving effect is a significant effect observed when a polyester resin is used as a powder.

The content of the styrenic resin (A4) in the resin component (A) is preferably 1 to 40 mass %, more preferably 2 to 30 mass %, still more preferably 3 to 15 mass %, and particularly preferably 3 to 10 mass % in the resin component (A). When the content is less than 1 mass %, due to a high shrinkage ratio a poor mold release and a poor appearance tend to occur. A content above 40 mass % is disadvantageous because this can cause an unsatisfactory weld strength and/or an unsatisfactory impact strength.

The resin component (A) in the polyester resin composition of the first invention may contain either the polyethylene terephthalate resin (A3) or the styrenic resin (A4), or the resin component (A) may contain both the polyethylene terephthalate resin (A3) and the styrenic resin (A4), wherein the resin component (A) more preferably contains both the component (A3) and the component (A4). The content of the polyethylene terephthalate resin (A3) and/or the styrenic resin (A4) in the resin component (A) is preferably 1 to 40 mass %, more preferably 5 to 35 mass %, and still more preferably 8 to 30 mass % in the resin component (A). The use of such a content is preferred because this supports the combination of, for example, the appearance and mechanical properties with the shrinkage ratio.

[Other Incorporated Components]

The polyester resin composition of the first invention may contain, within a range that does not impair the effects of the present invention, a thermoplastic resin other than those described in the preceding. This additional thermoplastic resin can be specifically exemplified by polycarbonate resins, polyacetal resins, polyamide resins, polyphenylene oxide resins, polyphenylene sulfide resins, polysulfone resins, polyethersulfone resins, polyetherimide resins, polyetherketone resins, and polyolefin resins.

Various additives other than the above may also be incorporated, and these additives can be exemplified by stabilizers, carbon black, mold releasing agents, flame retardants, flame retardant synergists, anti-dripping agents, ultraviolet absorbers, antistatic agents, antifogging agents, anti-blocking agents, plasticizers, dispersing agents, antiseptics, and colorants.

[Stabilizer]

The polyester resin composition of the first invention preferably contains a stabilizer because this has the effect of improving the thermal stability and preventing a deterioration in the mechanical strength, transparency, and color. The stabilizer is preferably a phosphorus stabilizer, a sulfur stabilizer, or a phenolic stabilizer, wherein phenolic stabilizers are particularly preferred.

The phosphorus stabilizers can be exemplified by phosphorous acids, phosphoric acid, phosphite esters, and phosphate esters, whereamong organophosphate compounds, organophosphite compounds, and organophosphonite compounds are preferred.

The organophosphate compound is preferably a compound with the following general formula.

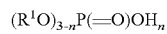

(In the formula, $R^1$ is an alkyl group or aryl group, and each may be the same as the others or may differ from the others. n is an integer from 0 to 2.) Long-chain ($R^1=C_{8\text{-}30}$) alkyl acid phosphate compounds are more preferred. Specific examples of the $C_{8\text{-}30}$ alkyl groups are the octyl group, 2-ethylhexyl group, isooctyl group, nonyl group, isononyl group, decyl group, isodecyl group, dodecyl group, tridecyl group, isotridecyl group, tetradecyl group, hexadecyl group, octadecyl group, eicosyl group, and triacontyl group.

The long-chain alkyl acid phosphates can be exemplified by octyl acid phosphate, 2-ethylhexyl acid phosphate, decyl acid phosphate, lauryl acid phosphate, octadecyl acid phosphate, oleyl acid phosphate, behenyl acid phosphate, phenyl acid phosphate, nonylphenyl acid phosphate, cyclohexyl acid phosphate, phenoxyethyl acid phosphate, alkoxypolyethylene glycol acid phosphate, bisphenol A acid phosphate, dimethyl acid phosphate, diethyl acid phosphate, dipropyl acid phosphate, diisopropyl acid phosphate, dibutyl acid phosphate, dioctyl acid phosphate, di-2-ethylhexyl acid phosphate, dioctyl acid phosphate, dilauryl acid phosphate, distearyl acid phosphate, diphenyl acid phosphate, and bis-nonylphenyl acid phosphate. Among these, octadecyl acid phosphate is preferred and can be acquired under the product name "Adeka Stab AX-71" from the ADEKA Corporation.

The organophosphite compound is preferably a compound with the following general formula.

(In the formula, $R^2$, $R^3$, and $R^4$ are each a hydrogen atom, an alkyl group having 1 to 30 carbon atoms, or an aryl group having 6 to 30 carbon atoms, and at least one of $R^2$, $R^3$, and $R^4$ is an aryl group having 6 to 30 carbon atoms.)

The organophosphite compound can be exemplified by triphenyl phosphite, tris(nonylphenyl) phosphite, dilauryl hydrogen phosphite, triethyl phosphite, tridecyl phosphite, tris(2-ethylhexyl) phosphite, tris(tridecyl) phosphite, tristearyl phosphite, diphenyl monodecyl phosphite, monophenyl didecyl phosphite, diphenyl mono(tridecyl) phosphite, tetraphenyl dipropylene glycol diphosphite, tetraphenyl tetra(tridecyl) pentaerythritol tetraphosphite, hydrogenated bisphenol A phenol phosphite polymer, diphenyl hydrogen phosphite, 4,4'-butylidenebis(3-methyl-6-tert-butylphenyl di(tridecyl) phosphite), tetra(tridecyl) 4,4'-isopropylidene diphenyl diphosphite, bis(tridecyl) pentaerythritol diphosphite, bis(nonylphenyl) pentaerythritol diphosphite, dilauryl pentaerythritol diphosphite, distearyl pentaerythritol diphosphite, tris(4-tert-butylphenyl) phosphite, tris(2,4-di-tert-butylphenyl) phosphite, hydrogenated bisphenol A pentaerythritol phosphite polymer, bis(2,4-di-tert-butylphenyl) pentaerythritol diphosphite, bis(2,6-di-tert-butyl-4-methylphenyl) pentaerythritol diphosphite, 2,2'-methylenebis(4,6-di-tert-butylphenyl) octyl phosphite, and bis(2,4-dicumylphenyl) pentaerythritol diphosphite. Bis (2,6-di-tert-butyl-4-methylphenyl) pentaerythritol diphosphite is preferred among the preceding.

The organophosphonite compound is preferably a compound with the following general formula.

$$R^5\text{—}P(OR^6)(OR^7)$$

(In the formula, $R^5$, $R^6$, and $R^7$ are each a hydrogen atom, an alkyl group having 1 to 30 carbon atoms, or an aryl group having 6 to 30 carbon atoms, and at least one of $R^5$, $R^6$, and $R^7$ is an aryl group having 6 to 30 carbon atoms.)

The organophosphonite compound can be exemplified by tetrakis(2,4-di-iso-propylphenyl)-4,4'-biphenylenediphosphonite, tetrakis(2,4-di-n-butylphenyl)-4,4'-biphenylenediphosphonite, tetrakis(2,4-di-tert-butylphenyl)-4,4'-biphenylenediphosphonite, tetrakis(2,4-di-tert-butylphenyl)-4,3'-biphenylenediphosphonite, tetrakis(2,4-di-tert-butylphenyl)-3,3'-biphenylenediphosphonite, tetrakis(2,6-di-iso-propylphenyl)-4,4'-biphenylenediphosphonite, tetrakis(2,6-di-n-butylphenyl)-4,4'-biphenylenediphosphonite, tetrakis(2,6-di-tert-butylphenyl)-4,4'-biphenylenediphosphonite, tetrakis(2,6-di-tert-butylphenyl)-4,3'-biphenylenediphosphonite, and tetrakis(2,6-di-tert-butylphenyl)-3,3'-biphenylenediphosphonite.

Any heretofore known sulfur atom-containing compound can be used as the sulfur stabilizer, whereamong thioethers are preferred. Specific examples are didodecyl thiodipropionate, ditetradecyl thiodipropionate, dioctadecyl thiodipropionate, pentaerythritol tetrakis(3-dodecylthiopropionate), thiobis(N-phenyl-β-naphthylamine), 2-mercaptobenzothiazole, 2-mercaptobenzoimidazole, tetramethylthiuram monosulfide, tetramethylthiuram disulfide, nickel dibutyldithiocarbamate, nickel isopropylxanthate, and trilauryl trithiophosphite. Pentaerythritol tetrakis(3-dodecylthiopropionate) is preferred among the preceding.

The phenolic stabilizers can be exemplified by pentaerythritol tetrakis[3-(3,5-di-t-butyl-4-hydroxyphenyl)propionate], octadecyl 3-(3,5-di-tert-butyl-4-hydroxyphenyl) propionate, thiodiethylenebis(3-(3,5-di-tert-butyl-4-hydroxyphenyl)propionate), and pentaerythritol tetrakis(3-(3,5-dineopentyl-4-hydroxyphenyl)propionate). Pentaerythritol tetrakis[3-(3,5-di-tert-butyl-4-hydroxyphenyl)propionate] and octadecyl 3-(3,5-di-t-butyl-4-hydroxyphenyl)propionate are preferred among the preceding.

The use of a hindered phenol stabilizer having a melting point of at least 150° C. is preferred among the preceding. The stabilizer itself has a high thermal stability when the melting point is at least 150° C., and this serves to suppress degradation and the loss of the stabilizing function and to suppress gas production even in high-temperature environments, e.g., during injection molding and during production of the resin composition, e.g., during melt kneading. In addition, even when the light-reflecting body provided by disposing a metal thin film on the obtained molded article is exposed to a high-temperature atmosphere, fogging of the surface of the light-reflecting body due to deteriorating the surface of the metal thin film is also suppressed. The melting point is more preferably at least 180° C., still more preferably at least 200° C., and particularly preferably at least 220° C. The upper limit on the melting point is generally not more than 350° C., preferably not more than 300° C., and more preferably not more than 280° C.

A single stabilizer may be incorporated or any combination of two or more in any proportions may be incorporated.

The content of the stabilizer is preferably 0.001 to 1 mass part per 100 mass parts of the total resin component (A) formed of the polybutylene terephthalate resin pellets (A1), the polyester resin powder (A2), and the additional resin incorporated on an optional basis. When the stabilizer content is less than 0.001 mass parts, little improvement in the compatibility and thermal stability of the resin composition can be expected and the occurrence during molding of a decline in the molecular weight and a deterioration in the color is facilitated. At above 1 mass part, it becomes present in an excess amount and a trend is assumed whereby the occurrence of silver streak production and color deterioration is further facilitated. The content of the stabilizer is more preferably 0.005 to 0.7 mass parts and is even more preferably 0.01 to 0.5 mass parts.

[Carbon Black]

The polyester resin composition of the first invention preferably also contains carbon black. The incorporation of carbon black functions to improve the weathering resistance and appearance of the polyester resin composition and the molded article and to improve the reflection characteristics of the metal vapor-deposited side.

There are no limitations on the carbon black with regard to its species, raw material type, or method of production, and any of, for example, furnace black, channel black, acetylene black, ketjen black, and so forth, can be used. The number-average particle diameter of the carbon black is not particularly limited, but is preferably 5 to 60 nm. The use of a carbon black having a number-average particle diameter in such a prescribed range makes it possible to obtain a composition for which blister production at high temperatures is inhibited. The number-average particle diameter can be determined according to the procedure described in ASTM D 3849 (Standard Test Method for Carbon Black—Morphological Characterization of Carbon Black Using Electron Microscopy), wherein an enlarged aggregate image is acquired, the particle diameter is measured from this aggregate image on 3,000 unit constituent particles, and the arithmetic average is taken.

The nitrogen adsorption specific surface area (unit: $m^2/g$) of the carbon black is preferably generally less than 1,000 $m^2/g$ and is more preferably 50 to 400 $m^2/g$. Having the nitrogen adsorption specific surface area be less than 1,000 $m^2/g$ provides an improving trend for the flowability of the polyester resin composition and the appearance of the molded article, and is thus preferred. The nitrogen adsorption specific surface area can be measured in accordance with JIS K 6217.

The dibutyl phthalate (DBP) absorption of the carbon black is preferably less than 300 $cm^3/100$ g and is more preferably 30 to 200 $cm^3/100$ g. Having the DBP absorption be less than 300 $cm^3/100$ g provides an improving trend for the flowability of the polyester resin composition of the present invention and the appearance of the molded article and is thus preferred.

The DBP absorption (unit: cm$^3$/100 g) can be measured in accordance with JIS K 6217. In addition, there are also no particular limitations on the pH of the carbon black used, but it is generally 2 to 10 and is preferably 3 to 9 and more preferably 4 to 8.

A single species of carbon black can be used by itself or two or more species can be used in combination. The carbon black may also be granulated using a binder and may also be used in the form of a master batch obtained by melt kneading at high concentrations in an additional resin. The use of a master batch obtained by melt kneading makes it possible to achieve improved handling properties during extrusion and an improved dispersibility in the resin composition. The resin here can be exemplified by polystyrenic resins, polyester resins, and acrylic resins.

The carbon black content in the master batch is preferably 10 to 80 mass %, more preferably 20 to 70 mass %, and even more preferably 30 to 60 mass %.

The carbon black content, expressed per 100 mass parts of the total resin component (A) formed of the polybutylene terephthalate resin pellets (A1), the polyester resin powder (A2), and the additional resin incorporated on an optional basis, is preferably 0.01 to 5 mass parts, more preferably at least 0.1 mass parts, even more preferably at least 0.3 mass parts, and particularly at least 0.5 mass parts and is more preferably not more than 2 mass parts, even more preferably not more than 1.5 mass parts, and particularly preferably not more than 1.0 mass parts. The weathering resistance may be unsatisfactory at a content of less than 0.01 mass parts; at above 5 mass parts, a trend is assumed whereby a decline in the moldability and the mechanical characteristics, e.g., the impact resistance and so forth, is facilitated.

[Mold Releasing Agent]

The polyester resin composition of the present invention preferably contains a mold releasing agent. This mold releasing agent can be exemplified by aliphatic carboxylic acids, esters from an alcohol and an aliphatic carboxylic acid, aliphatic hydrocarbon compounds, and polysiloxane-type silicone oils.

The aliphatic carboxylic acids can be exemplified by saturated and unsaturated aliphatic monobasic, dibasic, and tribasic carboxylic acids. Here, the aliphatic carboxylic acids also include alicyclic carboxylic acids. Among the preceding, the preferred aliphatic carboxylic acids are monobasic and dibasic carboxylic acids having from 6 to 36 carbons, and saturated aliphatic monobasic carboxylic acids having from 6 to 36 carbons are more preferred. These aliphatic carboxylic acids can be specifically exemplified by palmitic acid, stearic acid, caproic acid, caprin acid, lauric acid, arachic acid, behenic acid, lignoceric acid, cerotic acid, melissic acid, tetratriacontanoic acid, montanic acid, adipic acid, and azelaic acid.

For example, the same aliphatic carboxylic acids as described above can be used as the aliphatic carboxylic acid in the esters from an aliphatic carboxylic acid and an alcohol. The alcohol, on the other hand, can be exemplified by saturated and unsaturated monohydric and polyhydric alcohols. These alcohols may have a substituent such as, for example, the fluorine atom or an aryl group. Among the preceding, monohydric and polyhydric saturated alcohols having 30 or fewer carbons are preferred, while aliphatic saturated monohydric alcohols and aliphatic saturated polyhydric alcohols having 30 or fewer carbons are more preferred. Here, aliphatic also includes alicyclic compounds.

These alcohols can be specifically exemplified by octanol, decanol, dodecanol, stearyl alcohol, behenyl alcohol, ethylene glycol, diethylene glycol, glycerin, pentaerythritol, 2,2-dihydroxyperfluoropropanol, neopentylene glycol, ditrimethylolpropane, and dipentaerythritol.

The ester referenced above may contain an aliphatic carboxylic acid and/or an alcohol as an impurity. In addition, this ester may be a pure substance or may be a mixture of a plurality of compounds. Moreover, the aliphatic carboxylic acid bonded into a single ester may be a single species or any combination of two or more species in any proportions, and the alcohol bonded into a single ester may be a single species or any combination of two or more species in any proportions.

The ester from an aliphatic carboxylic acid and an alcohol can be specifically exemplified by montanic acid ester wax, beeswax (a mixture in which the major component is myricyl palmitate), stearyl stearate, behenyl behenate, stearyl behenate, glycerin monopalmitate, glycerin monostearate, glycerin distearate, glycerin tristearate, pentaerythritol monopalmitate, pentaerythritol monostearate, pentaerythritol distearate, pentaerythritol tristearate, and pentaerythritol tetrastearate.

The aliphatic hydrocarbon compound can be exemplified by liquid paraffins, paraffin waxes, microcrystalline waxes, polyolefin waxes such as polyethylene waxes, Fischer-Tropsch waxes, and oligomers of $C_{3-12}$ α-olefin. This aliphatic hydrocarbon also includes alicyclic hydrocarbons. These hydrocarbons may also be partially oxidized. The number-average molecular weight is preferably 200 to 30,000, more preferably 1,000 to 15,000, even more preferably 1,500 to 10,000, and particularly preferably 2,000 to 5,000. The aliphatic hydrocarbon compound may be a single substance, or a mixture of aliphatic hydrocarbon compounds having various constituent components and/or molecular weights can be used as long as the main component is within the range given above. Polyolefin waxes are preferred among the preceding.

Any heretofore known polyolefin wax can be used as the polyolefin wax, and examples here are (co)polymers (This indicates the polymer or copolymer and also applies in the following) that contain a single selection, or two or more selections in any proportions, from preferably $C_{2-30}$, more preferably $C_{2-12}$, and even more preferably $C_{2-10}$ olefins.

The $C_{2-30}$ olefins can be exemplified by ethylene, propylene, and $C_{4-30}$ (preferably $C_{4-12}$ and more preferably $C_{4-10}$) α-olefins and $C_{4-30}$ (preferably $C_{4-18}$ and more preferably $C_{4-8}$) dienes. The α-olefins can be exemplified by 1-butene, 4-methyl-1-pentene, 1-pentene, 1-octene, 1-decene, and 1-dodecene. The dienes can be exemplified by butadiene, isoprene, cyclopentadiene, and 11-dodecadiene.

The polyolefin wax is preferably a polyethylene wax from the standpoint of the mold release properties and the heat resistance. Any method may be used to produce the polyethylene wax; for example, it can be produced by the polymerization of ethylene or by the pyrolysis of polyethylene.

A mold releasing agent having an acid value of 10 to 40 mg KOH/g is preferred for the mold releasing agent because this provides a low mold release resistance, a significant improvement in the mold releasability, and a low volatile fraction. The acid value is more preferably 11 to 35 mg KOH/g and is even more preferably 12 to 32 mg KOH/g. A mold releasing agent having an acid value less than 10 mg KOH/g and a mold releasing agent having an acid value in excess of 40 mg KOH/g may be used as long as the acid value of the plurality of mold releasing agents as a whole is within the range of 10 to 40 mg KOH/g.

The following are preferred as mold releasing agents having an acid value of 10 to 40 mg KOH/g:

mold releasing agents that have an acid value of 10 to 40 mg KOH/g and are esters as described above of an aliphatic carboxylic acid and an alcohol;

modified polyolefin waxes obtained by modification with a functional group in an aliphatic hydrocarbon compound as described above and preferably into a polyolefin wax, wherein the functional group exhibits affinity for the polyester resin, and can be exemplified by e.g., carboxyl group (This indicates the carboxylic acid (anhydride) group, i.e., the carboxylic acid group and/or the carboxylic acid anhydride group; this also applies in the following), haloformyl group, ester group, metal carboxylate salt group, hydroxyl group, alkoxyl group, epoxy group, amino group, and amide group.

The carboxyl group used to modify the polyolefin wax can be exemplified by low molecular weight compounds that contain a carboxylic acid group, e.g., maleic acid, maleic anhydride, acrylic acid, and methacrylic acid; low molecular weight compounds that contain a sulfo group, e.g., sulfonic acid; and low molecular weight compounds that contain a phospho group, e.g., phosphonic acid. Among these, low molecular weight compounds that contain a carboxylic acid group are preferred, and maleic acid, maleic anhydride, acrylic acid, and methacrylic acid are particularly preferred. A single one of these carboxylic acids may be used or two or more may be used in combination in any proportions.

The amount of addition of the acid in the modified polyolefin wax is generally 0.01 to 10 mass % and preferably 0.05 to 5 mass % with reference to the modified polyolefin wax.

The haloformyl group can be specifically exemplified by the chloroformyl group and bromoformyl group. The means for modification with these functional groups to the polyolefin wax may be any heretofore known method and can be specifically exemplified by any method such as copolymerization with a compound containing the functional group or post-processing, e.g., oxidation.

The functional group species is preferably the carboxyl group for its favorable affinity with the polyester resin. The concentration of the carboxyl group in the modified polyolefin wax may be determined by selection as appropriate; however, when it is too low, the affinity with the polyester resin is low, the suppressing effect on the volatile fraction is low, and the mold releasing effect may decline. Conversely, when this concentration is too high, for example, the molecular main chain constituting the polyolefin wax may undergo excessive scission during modification and the molecular weight of the modified polyolefin wax may then be excessively lowered and as a result a volatile fraction may be produced in large amounts and fogging may be produced at the surface of the polyester resin molded article. An oxidized polyethylene wax is preferred for the modified polyolefin wax.

A single mold releasing agent may be incorporated or any combination of two or more in any proportions may be incorporated.

The content of the mold releasing agent, per 100 mass parts of the total resin component (A) formed of the polybutylene terephthalate resin pellets (A1), the polyester resin powder (A2), and the additional resin incorporated on an optional basis, is generally at least 0.001 mass parts and is preferably at least 0.01 mass parts and is generally not more than 2 mass parts and is preferably not more than 1 mass part. The mold releasing effect may be unsatisfactory when the mold releasing agent content is less than the lower limit value for the indicated range. When the mold releasing agent content exceeds the upper limit value for the indicated range, for example, a reduction in the hydrolysis resistance, mold staining during injection molding, and so forth may occur.

[Production Method for the Polyester Resin Composition of the First Invention]

The method of producing the polyester resin composition of the first invention can be carried out according to common methods for preparing resin compositions. The polybutylene terephthalate resin pellets (A1), polyester resin powder (A2), inorganic filler (B), and additional resin component and additives that are added as desired are thoroughly mixed together followed by melt kneading with a single-screw or twin-screw extruder. In addition, the resin composition may also be prepared by feeding the individual components to the extruder using a feeder, either without preliminary mixing or with preliminary mixing of only a portion thereof, and carrying out melt kneading. For example, a polyester resin composition production method may be used in which the polybutylene terephthalate resin pellets (A1) are melt kneaded with a preblend obtained by preliminarily blending the inorganic filler (B) into the polyester resin powder (A2). In this case, the preblend and the polybutylene terephthalate resin pellets (A1) may also be fed to the extruder from separate feeders. In addition, melt kneading may be performed with the blending of a portion that has been made into a master batch. Moreover, various molded articles may also be produced by preliminarily mixing the individual components to give a mixture and feeding this mixture, as such and without melt kneading, to a molding machine, e.g., an injection molding machine.

The heating temperature during melt kneading can generally be selected as appropriate from the range of 220 to 300° C. An excessively high temperature can facilitate the generation of decomposition gases, which can cause a poor appearance. It is therefore desirable to select the screw structure considering, for example, the shear-generated heating. An antioxidant and/or thermal stabilizer is desirably used in order to inhibit decomposition during kneading and during the ensuing molding.

[Molded Articles from the Polyester Resin Composition of the First Invention]

There are no particular limitations on the method of producing molded articles using the polyester resin composition of the first invention, and any molding method generally used for polyester resin compositions can be used. Examples here are injection molding methods, ultrahigh speed injection molding methods, injection compression molding methods, two-color molding methods, blow molding methods such as gas-assisted molding, molding methods using insulated molds, molding methods using rapidly heated molds, foam molding (also including supercritical inert gas foam molding), insert molding, IMC (in-mold coating molding) molding methods, extrusion molding methods, sheet molding methods, thermoforming methods, rotational molding methods, laminate molding methods, press molding methods, and blow molding methods. Injection molding methods are preferred among the preceding for their productivity and because the effects of the present invention, e.g., excellent surface properties for the obtained molded article, are quite substantial with injection molding methods.

The molded article—due to the low shrinkage ratio and excellent mold release properties with maintaining a high mechanical strength, the excellent surface properties and excellent appearance for a molded article and excellent appearance when vapor deposited, and the suppression of the production of fogging even during high-temperature use—is particularly suitable for use as the base for a light-reflecting body, for which these properties are strictly required.

A molded article molded from the polyester resin composition of the first invention by, for example, injection molding, has a high surface smoothness, and the maximum roughness height Ry of the surface of the molded article is preferably not more than 5.5 μm, more preferably not more than 5 μm, still more preferably not more than 4 μm, particularly preferably not more than 3 μm, and most preferably not more than 2.5 μm. The arithmetic average roughness Ra is excellent at preferably not more than 0.5 μm, more preferably not more than 0.3 μm, still more preferably not more than 0.25 μm, and particularly preferably not more than 0.2 μm, and as a consequence roughness, fogging, and a foreign material perception do not appear after the execution of metal vapor deposition, and it is thus well suited for a light-reflecting body, e.g., a lamp extension and so forth.

[Polyester Resin Composition of the Second Invention]

The polyester resin composition of the second invention of the present invention is a polyester resin composition that contains 0.1 to 20 mass parts of (B) an inorganic filler that has an average primary particle diameter of not more than 2.5 μm and a specific gravity of not more than 3 g/cm$^3$, per 100 mass parts of (A) a resin component that contains a polybutylene terephthalate resin, and is characterized in that the maximum roughness height Ry of the surface of a molded article obtained by the injection molding of the polyester resin composition under the injection conditions indicated below is not more than 5.5 μm.

Since this is a resin composition that provides a maximum roughness height Ry of not more than 5.5 μm for the molded article surface, the surface smoothness when made into a molded article is high; roughness, fogging, and a foreign material perception do not appear after the execution of metal vapor deposition; and it is thus well suited for a light-reflecting body, e.g., a lamp extension and so forth. In addition, due to this excellent surface smoothness, metal vapor deposition may be directly executed without a primer treatment.

The maximum roughness height Ry (according to JIS B 0601) of the molded article surface is preferably not more than 5 μm, more preferably not more than 4 μm, still more preferably not more than 3 μm, and particularly preferably not more than 2.5 μm. The arithmetic average roughness Ra (according to JIS B 0601) is preferably not more than 0.5 μm, more preferably not more than 0.3 μm, even more preferably not more than 0.25 μm, and particularly preferably not more than 0.2 μm.

The following are the conditions during the injection molding of the molded article for measurement of the maximum roughness height Ry and arithmetic average roughness Ra of the molded article surface.

pre-drying: 120° C., 5 hours, hot-air drying
cylinder temperature: 260° C.
injection time: 30 sec
injection rate: 60 mm/sec
holding pressure: 60 MPa
cooling time: 15 sec
mold: mirror-surface mold, surface-finished with #14000, temperature of 60° C.
shape of the molded article: 60 mm×60 mm×3 mm thickness In addition, for an aluminum vapor deposition carried out without a primer treatment so as to provide an aluminum film thickness of 150 nm on the surface of a molded article obtained by the method described above, the diffuse reflectance on the side of the aluminum vapor-deposited layer is preferably less than 2%, more preferably less than 1.5%, and still more preferably less than 1%. The specific method for measuring the diffuse reflectance here is described in the examples.

[Resin Component (A) Containing a Polybutylene Terephthalate Resin]

The polyester resin composition of the second invention contains a polybutylene terephthalate resin for resin component (A). The same polybutylene terephthalate resins as used for the polybutylene terephthalate resin pellets (A1) in the polyester resin composition of the first invention can be used for the polybutylene terephthalate resin here. The preferred polybutylene terephthalate resin for the polyester resin composition of the second invention is also as described above.

The resin component other than polybutylene terephthalate resin is not particularly limited and can be exemplified by polyester resins other than polybutylene terephthalate resin, e.g., polyethylene terephthalate resins, and also by styrenic resins, polycarbonate resins, polyacetal resins, polyamide resins, polyphenylene oxide resins, polyphenylene sulfide resins, polysulfone resins, polyethersulfone resins, polyetherimide resins, polyetherketone resins, polyolefin resins, and fluororesins. Polyethylene terephthalate resins and styrenic resins are preferred among the preceding.

The same polyethylene terephthalate resins as for the polyester resin composition of the first invention can be used for the polyethylene terephthalate resin here. The preferred polyethylene terephthalate resin for the polyester resin composition of the second invention is also as described above.

The content of the polyethylene terephthalate resin in the resin component (A) is preferably 1 to 40 mass %, more preferably 5 to 35 mass %, even more preferably 8 to 30 mass %, and particularly preferably 10 to 25 mass % in the resin component (A). The surface smoothness tends to be unsatisfactory when the content is less than 1 mass %. It is disadvantageous for the content to exceed 40 mass % because crystallization and solidification are then slow, which can cause a lengthening of the cooling time and a poor mold release.

The same styrenic resin as the styrenic resin (A4) for the polyester resin composition of the first invention can be used as the styrenic resin here. The preferred styrenic resin for the polyester resin composition of the second invention is also as described above.

The content of the styrenic resin in the resin component (A) is preferably 1 to 40 mass %, more preferably 2 to 30 mass %, still more preferably 3 to 15 mass %, and particularly preferably 3 to 10 mass % in the resin component (A). When the content is less than 1 mass %, due to a high shrinkage ratio a poor mold release and a poor appearance tend to occur. A content above 40 mass % is disadvantageous because this can cause an unsatisfactory weld strength and/or an unsatisfactory impact strength.

The resin component (A) in the polyester resin composition of the second invention may contain either the aforementioned polyethylene terephthalate resin or the aforementioned styrenic resin or the resin component (A) may contain both the polyethylene terephthalate resin and the styrenic resin, wherein the resin component (A) more preferably contains both the polyethylene terephthalate resin and the styrenic resin. The content of the polyethylene terephthalate resin and/or the styrenic resin in the resin component (A) is preferably 1 to 40 mass %, more preferably 5 to 35 mass %, and still more preferably 8 to 30 mass % in the resin component (A). The use of such a content is preferred because this supports the combination of, for example, the appearance and mechanical properties with the shrinkage ratio.

[Inorganic Filler (B)]

The polyester resin composition of the second invention contains 0.1 to 20 mass parts of (B) an inorganic filler that has an average primary particle diameter of not more than 2.5 μm and a specific gravity of not more than 3 $g/cm^3$.

There are no particular limitations on the inorganic filler (B) as long as, it has an average primary particle diameter of not more than 2.5 μm and a specific gravity of not more than 3 $g/cm^3$, and a selection from the inorganic filler (B) for the polyester resin composition of the first invention can be used.

The average primary particle diameter of the inorganic filler (B) is not more than 2.5 μm: when 2.5 μm is exceeded, the surface smoothness of the molded article declines and a poor appearance is obtained when the vapor deposition of a metal, e.g., aluminum, is directly executed on the surface. The average primary particle diameter is preferably not more than 2 μm, more preferably not more than 1 μm, even more preferably not more than 0.5 μm, and particularly preferably not more than 0.4 μm. The lower limit is generally 0.01 μm and is preferably 0.05 μm, more preferably 0.08 μm, and particularly preferably 0.1 μm. The method for measuring the average primary particle diameter of the inorganic filler (B) in the present invention is as described above.

The specific gravity of the inorganic filler (B) is not more than 3 $g/cm^3$ and preferably not more than 2.8 $g/cm^3$. The method for measuring the specific gravity of the inorganic filler (B) is as described above.

In order to improve the affinity with the resin, a surface treatment is preferably carried out on the inorganic filler (B). The preferred surface-treatment agents and treatment methods are also as described above.

The content of the inorganic filler (B) is 0.1 to 20 mass parts per 100 mass parts of the resin component containing polybutylene terephthalate resin. When this content is less than 0.1 mass parts, the heat resistance is unsatisfactory and the shrinkage ratio is not adequately lowered. Conversely, when 20 mass parts is exceeded, an excellent appearance is not obtained due to an increase in aggregates originating from the inorganic filler. The content of the inorganic filler (B), expressed per 100 mass parts of the resin component containing polybutylene terephthalate resin, is preferably at least 1 mass part, more preferably at least 2 mass parts, and even more preferably at least 2.5 mass parts and is preferably not more than 15 mass parts, more preferably not more than 10 mass parts, and particularly preferably not more than 7 mass parts.

[Other Incorporated Components]

The polyester resin composition of the second invention may contain various additives other than the above, and these additives can be exemplified by stabilizers, carbon black, mold releasing agents, flame retardants, flame retardant synergists, anti-dripping agents, ultraviolet absorbers, antistatic agents, antifogging agents, anti-blocking agents, plasticizers, dispersing agents, antiseptics, and colorants. Among the preceding, the incorporation of a stabilizer, carbon black, and mold releasing agent is preferred. The same additives as those used for the first polyester resin composition of the present invention can be used for these additives, and the preferred additives are also as described above.

[Production Method for the Polyester Resin Composition of the Second Invention]

The method of producing the polyester resin composition of the second invention of the present invention should be a procedure that satisfies the requirement of a maximum roughness height Ry of not more than 5.5 μm for the surface of the molded article obtained by the injection molding of the resulting polyester resin composition, but is not otherwise particularly limited. The polyester resin composition of the second invention is preferably produced by a melt-kneading method using a melt kneader such as an extruder. However, it is difficult to carry out the stable production of the polyester resin composition of the second invention by just mixing the individual starting components of the polyester resin composition and simply kneading, and kneading by a special method is recommended.

A preferred method is described in the following for carrying out the stable production of the polyester resin composition of the second invention.

The (A) resin component containing polybutylene terephthalate resin and the (B) inorganic filler having an average primary particle diameter of not more than 2.5 μm and a specific gravity of not more than 3 are mixed in prescribed proportions, followed by feed to a single-screw or twin-screw extruder provided with a die nozzle, then melt kneading, extrusion of the resin composition from the die nozzle into a strand form, and subsequently cutting to produce pellets.

The use of a twin-screw extruder for the melt kneader is preferred here. The L/D, which is the ratio between the length L (mm) of the screw and the diameter D (mm) of the same screw, preferably satisfies the relationship 30<(L/D)<90 and more preferably satisfies 35<(L/D)<80. A value of 30 or less for this ratio is unfavorable because this facilitates a deterioration in the surface smoothness in association with a poor dispersion of the inorganic filler; conversely, 90 and above is unfavorable because the resin residence time then becomes extended and as a consequence, for example, discoloration and outgassed components increase accompanying thermal deterioration.

With regard to the structure of the extruder screw, a structure having a kneading unit is preferred. A kneading unit at one or two positions is preferred. When a kneading unit is not present, kneading is prone to be unsatisfactory and, due to, for example, secondary aggregation of the inorganic filler (B), Ry and Ra readily become large and the appearance may decline. The presence of spiral kneading units at three or more positions is unfavorable because in this case a long residence time within the extruder occurs and the resin temperature may undergo an excessive increase and as a result gel-like foreign material and scorching may be produced.

A countermeasure to prevent blocking, e.g., an agitator, is preferably implemented during the feed of the raw materials to the melt kneader, e.g., the extruder.

In addition, the resin temperature during melt kneading, considered as the resin temperature at the outlet from the extruder, is preferably not more than 320° C., more preferably not more than 310° C., and still more preferably not more than 300° C., and is generally at least 255° C. and preferably at least 260° C. A too high resin temperature is unfavorable because this risks discoloration of the polyester resin composition and an increase in scorched material. A too low resin temperature is unfavorable because kneading is then inadequate and a large Ry and large Ra are facilitated due to, for example, secondary aggregation of the inorganic filler (B), and the appearance may be impaired.

The screw rotation rate Ns during melt kneading is preferably 100 to 1,000 rpm, more preferably 200 to 900 rpm, and even more preferably 500 to 800 rpm. The appearance assumes a deteriorating trend due to a poor dispersion of the inorganic filler at a screw rotation rate below 100 rpm, which is thus unfavorable. Above 1,000 rpm is also unfavorable because the outgassed component may then increase accompanying deterioration of the resin.

The ratio Q/Ns between the output Q (kg/hr) during melt kneading and the screw rotation rate Ns (rpm) is preferably at least 0.1, more preferably at least 0.3, and still more preferably at least 0.5. Not more than 2 is preferred; not more than 1.5 is more preferred; and not more than 1 is still more preferred. It is unfavorable for this value to be too low because the resin temperature then becomes too high and/or the residence time becomes too long and as a result the polyester resin composition may undergo discoloration and/or the scorched material may increase. It is also unfavorable for this value to be too large because a large Ry and a large Ra are then facilitated due to, for example, secondary aggregation of the inorganic filler (B), and the appearance may be impaired.

A continuous kneader is also preferably used as the kneader. A continuous kneader is a kneader that has a plurality of rotating blades disposed on a screw that is itself rotatably attached within the cylinder of an extruder, and that also has fixed blades disposed within the cylinder wherein the fixed blades are inserted in between the plurality of rotating blades. The starting material, which is transported along the axis of the screw when the screw is rotated, is kneaded by a zigzag passage through the gap formed between a rotating blade and a fixed blade, i.e., by being fed from the center side to the outer peripheral side and then from the outer peripheral side to the center side. As a result, three actions, i.e., compression, shear, and displacement, can be very efficiently applied to the starting material and the dispersibility of the inorganic filler (B) can then be more effectively enhanced than is the case with a single-screw or twin-screw extruder. There are no particular limitations on the blade shape, and, for example, fan-shaped blades, *chrysanthemum*-shaped blades, and mortar shaped blades can be used. This continuous kneader can be exemplified by the "Miracle K.C.K." from ASADA IRONWORKS CO., LTD.

The production of the polyester resin composition of the second invention is also facilitated by the use as resin component (A) of a resin component (A) that contains a polyester resin powder.

The same polyester resin as the polyester resin powder (A2) used to produce the first polyester resin composition can be used as the polyester resin used in the polyester resin powder here, and the preferred polyester resin is also as described above. The use of polybutylene terephthalate resin or polyethylene terephthalate resin is preferred, and polybutylene terephthalate resin is more preferred. The method of producing the polyester resin powder is also as described above.

The polyester resin powder preferably has an average particle diameter of 50 to 1,300 µm. At below 50 µm, a trend is assumed wherein the occurrence of production problems, for example, blocking in the resin composition production step, is facilitated. In addition, when the average particle diameter is too large, the maximum roughness height Ry and the arithmetic average roughness Ra of the molded article surface readily become large and the appearance tends to be poor. The average particle diameter of the polyester resin powder is more preferably at least 100 µm, even more preferably at least 300 µm, still more preferably at least 500 µm, and particularly preferably at least 700 µm, and is more preferably not more than 1,200 µm, even more preferably not more than 1,100 µm, and particularly preferably not more than 1,000 µm. The method for measuring the average particle diameter of the polyester resin powder is as described above.

The bulk density of the polyester resin powder is preferably 0.2 to 0.8 g/cm$^3$ and is more preferably 0.3 to 0.7 g/cm$^3$ and is even more preferably 0.4 to 0.6 g/cm$^3$. The use of a polyester resin powder having such a bulk density is preferred because this facilitates the suppression of scattering and classification of the inorganic filler (B) during production of the resin composition and inhibits the occurrence of a poor appearance caused by the secondary aggregation of the inorganic filler (B). Here, the bulk density denotes the value measured by the method described in JIS K 7365.

The content of the polyester resin powder in the resin component (A) is preferably 1 to 50 mass % in the resin component (A) and is more preferably at least 3 mass %, still more preferably at least 5 mass %, and particularly preferably at least 7 mass % and is more preferably not more than 45 mass %, still more preferably not more than 40 mass %, particularly preferably not more than 30 mass %, and most preferably not more than 20 mass %. It is thought that, by incorporating the polyester resin powder in the indicated range, a better state of dispersion is provided than for mixing with the inorganic filler (B) in the presence of only the resin pellets; the secondary aggregation of the inorganic filler (B) is then inhibited and a uniform dispersion is achieved; and a molded article exhibiting an excellent appearance and surface properties is thus obtained while maintaining a high mechanical strength.

In addition, when a polyester resin powder is used, the maximum sliding shear stress of the blend of the polyester resin powder and the inorganic filler (B) is preferably not more than 10 N, more preferably not more than 8 N, even more preferably not more than 6 N, particularly preferably not more than 5 N, and most preferably not more than 4 N. Having the blend of the polyester resin powder and the inorganic filler (B) exhibit such a maximum sliding shear stress is preferred because this effectively improves upon the problem of the poor appearance caused by secondary aggregation of the inorganic filler (B), facilitates the occurrence of a small maximum roughness height Ry and a small arithmetic average roughness Ra for the molded article surface, and supports a stable feed during production of the resin composition, e.g., during melt kneading.

The average particle diameter of the polyester resin powder is also preferably 1,000- to 8,000-times the average primary particle diameter of the inorganic filler. The use of a combination of the inorganic filler (B) with a polyester resin powder having such an average particle diameter is preferred because this effectively improves upon the problem of the poor appearance caused by secondary aggregation of the inorganic filler (B), facilitates the occurrence of a small maximum roughness height Ry and a small arithmetic average roughness Ra for the molded article surface, and supports a stable feed during production of the resin composition, e.g., during melt kneading. The average particle diameter of the polyester resin powder is more preferably 2,000- to 7,500-times, even more preferably 3,000- to 7,000-times, particularly preferably 3,000- to 6,500-times, and particularly preferably 4,000- to 6,000-times the average primary particle diameter of the inorganic filler (B).

The mass ratio between the contents of the polyester resin powder and the inorganic filler (B) (polyester resin powder: inorganic filler (B)) is preferably 30:70 to 95:5, more preferably 40:60 to 93:7, and even more preferably 50:50 to 90:10. The use of such content proportions is preferred because this provides an excellent state of dispersion for the inorganic filler, facilitates the occurrence of a small maximum roughness height Ry and a small arithmetic average roughness Ra for the molded article surface, and supports a stable feed during production of the resin composition, e.g., during melt kneading.

The second polyester resin composition can be produced using a single one of the aforementioned preferred conditions or using a combination of a plurality of these preferred conditions; however, among the aforementioned preferred conditions, it is effective to adopt to use the polyester resin powder as a resin component, and to apply production conditions wherein a continuous kneader is used.

The use of such a method for producing the polyester resin composition of the second invention facilitates the stable production of a polyester resin composition that will provide a maximum surface height Ry of not more than 5.5 μm when made into a molded article as described above. However, the method of producing the second polyester composition is not limited to such a method, and another method may be used as long as the preferred maximum surface height Ry as described above is provided.

[Molded Articles from the Polyester Resin Composition of the Second Invention]

[Molded Articles]

There are no particular limitations on the method for producing molded articles using the polyester resin composition of the second invention, and, for example, any of the molding methods used with the polyester resin composition of the first invention can be used. Injection molding methods are preferred here for their productivity and because the effects of the present invention, e.g., excellent surface properties for the obtained molded article, are quite substantial with injection molding methods.

Molded articles molded from the polyester resin composition of the second invention by, for example, injection molding, have a high surface smoothness and an excellent appearance and as a consequence, roughness, fogging, and a foreign material perception do not appear after the execution of metal vapor deposition, and they are thus well suited for a light-reflecting body, e.g., a lamp extension and so forth. In addition, metal vapor deposition can be carried out directly without a primer treatment.

[Light-Reflecting Body]

The light-reflecting body of the present invention is a light-reflecting body that has a light-reflecting layer on a light-reflecting base body formed of the polyester resin composition of the present invention obtained by the methods described above, and that preferably has the light-reflecting layer directly on the surface of the light-reflecting base body.

The light-reflecting layer generally is a metal thin film layer formed by, for example, the vapor deposition of a metal, and is formed on a surface of the light-reflecting base body. The metal vapor deposition method is not particularly limited and any heretofore known method may be used. The following method is provided as an example.

The light-reflecting base body is placed in a vapor deposition apparatus under a vacuum, and oxygen and an inert gas, e.g., argon, are introduced followed by the execution of a plasma activation treatment on the surface of the light-reflecting base body. An electrode holding a target in the vapor deposition apparatus is then energized and sputtered particles (for example, aluminum particles), obtained by sputtering due to in inductive-discharge plasma within the chamber, become attached to the light-reflecting base body. As necessary, a protective film for the aluminum vapor-deposited film may be applied to the surface of the aluminum vapor-deposited film by, for example, the plasma polymerization treatment of a silicon-containing gas or ion plating with silicon oxide.

The light-reflecting base body of the present invention is particularly useful in cases in which a metal thin film is directly disposed on a surface of the light-reflecting base body without the formation of an undercoat. Thus, the light-reflecting base body of the present invention has excellent surface properties and, even when metal vapor deposition is carried out directly on its surface without the execution of a primer treatment, it exhibits an excellent adhesiveness to the metal thin film and provides an excellent glossy surface. In addition, the light-reflecting base body exhibits high mold releasability from the mold during injection molding and because of this the occurrence of mold transfer unevenness can also be suppressed.

The metal used for the metal thin film can be exemplified by chromium, nickel, aluminum, and so forth, whereamong aluminum is preferred. In order to increase the adhesive strength between the metal thin film and the surface of the light-reflecting base body, the surface of the light-reflecting base body may be cleaned and degreased before vapor deposition.

The diffuse reflectance on the light-reflecting layer side of a light-reflecting body having a light-reflecting layer disposed on such a light-reflecting base body, is preferably less than 2%, more preferably less than 1.5%, and still more preferably less than 1%. In particular, the diffuse reflectance when aluminum (150 nm thickness) is used as the light-reflecting layer is preferably less than 2%, more preferably less than 1.5%, and even more preferably less than 1%. Excellent light-focusing characteristics can be attained by establishing such a diffuse reflectance. This diffuse reflectance denotes the value measured at a wavelength of 550 nm using a regular-reflection-light-excluded system.

The light-reflecting body can be exemplified by various types of light applications. The light applications can be exemplified by light applications for lighting in building structures and also for automobiles, aircraft, and ships, and preferred specific examples are the housings, reflectors, lamp extensions, and so forth for, for example, lamps for vehicles, e.g., automobiles.

A lamp extension is disposed around the lamp within the lamp compartment formed by the body and cover (or outer lens) of the light fixture and is required for the reflectivity and directionality of the lamp light source to exhibit a high brightness, smoothness, a uniform reflectance, and a heat resistance capable of withstanding the heat generated from the light source. A mirror treatment using a metal thin film layer obtained by the vapor deposition of a metal, e.g., aluminum is executed on at least one surface of the lamp extension. Lamp extensions for automotive light applications are frequently used in headlamps and tail lamps, but there is no limitation to these and the lamp extensions used in headlights (headlamps), tail lights (tail lamps), brake lights (stop lamps), directional indicators (so-called turn signals), vehicle width lamps, backing lights, and so forth, are included.

EXAMPLES

The present invention is more specifically described using the examples given below. However, the present invention should not be construed as being limited to or by the examples that follow.

The components used in the following examples and comparative examples are given in the following Table 1.

TABLE 1

| component | code | |
|---|---|---|
| polybutylene terephthalate resin pellets (A1) | A1-1 | "Novaduran" pellets, from Mitsubishi Engineering-Plastics Corporation intrinsic viscosity = 0.85 dl/g |
| | A1-2 | "Novaduran" pellets, from Mitsubishi Engineering-Plastics Corporation intrinsic viscosity = 1.20 dl/g |
| polybutylene terephthalate resin powder (A2) | A2 | "Novaduran" powder (intrinsic viscosity = 0.85 dl/g), cryogenically pulverized product, from Mitsubishi Engineering-Plastics Corporation average particle diameter D50: 853 μm bulk density: 0.559 g/cm$^3$ |
| polyethylene terephthalate resin (A3) | A3 | polyethylene terephthalate resin pellets "Novapet PBK1", from Mitsubishi Chemical Corporation intrinsic viscosity = 0.64 dl/g |
| styrenic resin (A4) | A4 | acrylonitrile-styrene copolymer (AS resin) "AP-A", from UMG-ABS Ltd. average particle diameter D50: 412 μm |
| inorganic filler (B) | B1 | synthetic calcium carbonate "Brilliant-1500", from SHIRAISHI CALCIUM KAISHA, LTD. average primary particle diameter: 150 nm specific gravity: 2.8, no surface treatment |
| | B2 | natural calcium carbonate "BF-200", from SHIRAISHI CALCIUM KAISHA, LTD. average primary particle diameter: 5 μm specific gravity: 2.8, no surface treatment |
| | B3 | synthetic calcium carbonate, with neutral surface treatment "RK-75NC", from SHIRAISHI CALCIUM KAISHA, LTD. average primary particle diameter: 150 nm specific gravity: 2.8 |
| | B4 | talc "SG-200", from Nippon Talc Co., Ltd. average primary particle diameter: 2.7 μm aspect ratio: 10, specific gravity: 2.8 |
| mold releasing agent | C1 | montanic acid ester wax "Licowax E", from Clariant acid value: 18 mg KOH/g |
| | C2 | oxidized polyethylene wax "Licowax PED522", from Clariant acid value: 25 mg KOH/g |
| | C3 | polyethylene wax "Licowax PE520", from Clariant acid value: 0 mg KOH/g |
| stabilizer | D | hindered phenol stabilizer "AO-330", from the ADEKA CORPORATION melting point: 244° C. |
| carbon black | E | carbon black master batch (CB content: 30 mass %, PBT: 70 mass %) "I-star MBC0010", from ICHIKIN Co., Ltd. |

[Shear Stress]

Of the individual components in the formulations given in Table 2 below, the polybutylene terephthalate resin powder (A2) and the inorganic filler (B) were preliminarily mixed for 3 minutes in a Henschel mixer, and the shear stress was then measured on this using a powder shear tester (Tsutsui Scientific Instruments Co., Ltd.). The volume of the measurement cell was 60×60×60 mm; the consolidation conditions were a load of 5 kg for 3 minutes; and the maximum shear stress was measured using the condition of a shear rate of 6 mm/min.

Examples 1 to 8 and Comparative Examples 1 to 4

The components shown in Table 1 above were mixed to uniformity with a tumbler mixer in the proportions (mass parts in all instances) given in Table 2; a resin composition was then prepared by melt kneading using a twin-screw extruder ("TEX30α", from The Japan Steel Works, LTD., L/D=42) and the conditions of a cylinder set temperature of 260° C., a screw rotation rate of 200 rpm, and Q/N=0.2; and quenching was carried out in a water bath and pelletization was performed using a pelletizer to obtain pellets of the polyester resin composition. The resin temperature at the extruder outlet was 282° C.

[Flowability (MVR)]

Using a Melt Indexer from the Takara Co. and the pellets obtained as described above, the melt volume-flow rate MVR (unit: cm$^3$/10 min) per unit time was measured under conditions of 265° C. and a load of 2.16 kgf.

[Mold Shrinkage Ratio]

The pellets obtained as described above were dried for 5 hours at 120° C. followed by the molding, using an injection molding machine ("NEX80" from NISSEI PLASTIC INDUSTRIAL CO., LTD.), of a length 100 mm×width 100 mm×thickness 2 mm flat square plate using a film-gate mold and conditions of a cylinder temperature of 260° C. and a mold temperature of 60° C. The mold shrinkage ratio (unit: %) was measured in the direction perpendicular to the resin flow direction (TD direction) in the molded article and in the direction parallel to the flow (MD direction).

[Tensile Strength at Break, Tensile Elongation at Break]

The pellets obtained as described above were dried for 5 hours at 120° C. followed by the injection molding of an ISO multipurpose test specimen (thickness=4 mm) using an injection molding machine from The Japan Steel Works, Ltd. (mold clamping force=85T) and conditions of a cylinder temperature of 250° C. and a mold temperature of 80° C.

Using this ISO multipurpose test specimen (thickness=4 mm), the tensile strength at break (unit: MPa) and the tensile elongation at break (unit: %) were measured in accordance with ISO 527.

[Maximum Flexural Strength, Flexural Modulus]

Using the ISO multipurpose test specimen (thickness=4 mm) described above, the maximum flexural strength (unit: MPa) and the flexural modulus (unit: MPa) were measured in accordance with ISO 178 at a temperature of 23° C.

[Notched Charpy Impact Strength]

Using a notched test specimen obtained by notching the above-described ISO multipurpose test specimen (thickness=4 mm), the notched Charpy impact strength (unit: kJ/m$^2$) was measured in accordance with ISO 179 at a temperature of 23° C.

[Mold Release Properties]

The pellets obtained as described above were dried for 5 hours at 120° C. and were then molded into a box-shaped molded article (thickness 1.5 mmt, outer dimensions 30×50×depth 30 mm) using an injection molding machine (clamping force 50T) from Sumitomo Heavy Industries, Ltd. under conditions of a cylinder temperature of 260° C., a mold temperature of 60° C., and a cooling time of 10 sec. The maximum value of the release resistance during demolding by ejection with the ejector pin was evaluated and designated the mold release resistance. A maximum value for the release resistance of not more than 15 MPa can be regarded as an unproblematic level for actual product production.

[Evaluation of Appearance]

The pellets obtained as described above were dried for 5 hours at 120° C. prior to injection molding and a light-reflecting base body with a molded article shape of 60 mm×60 mm×3 mm was obtained using an injection molding machine ("NEX80" from NISSEI PLASTIC INDUSTRIAL CO., LTD.), using a mirror-surface mold surface-finished with #14000, and using conditions of a cylinder temperature of 260° C., an injection rate of 60 rum/sec, an injection time of 30 sec, a holding pressure of 60 MPa, a cooling time of 15 sec, and a mold temperature of 60° C.

A light-reflecting body was obtained by carrying out aluminum vapor deposition, without executing a primer treatment, on a surface of the obtained light-reflecting base body to provide an aluminum film thickness of 150 nm.

[Surface Roughness of the Molded Article]

Using a "VK-8500" laser microscope from KEYENCE CORPORATION, the surface roughness of the light-reflecting base body obtained as described above was measured at 5 randomly selected 100 μm×100 μm regions using conditions of a magnification of 500× and a measurement pitch of 0.1 μm. The arithmetic average roughness (Ra) and the maximum roughness height (Ry) were measured in accordance with JIS B 0601.

[Aggregates]

The surface of the light-reflecting base body was visually inspected, and the absence of appearance defects, e.g., surface bumps and dents caused by aggregation of the inorganic filler and so forth, was scored as a "pass" while their presence was scored as a "fail".

[Diffuse Reflectance of the Aluminum Vapor-Deposited Side]

Using a spectrophotometer ("CM-3600d", from Konica Minolta, Inc.), the diffuse reflectance on the aluminum vapor-deposited side of the aforementioned aluminum vapor-deposited light-reflecting body was measured at a wavelength of 550 nm by a regular-reflection-light-excluded procedure. A diffuse reflectance of less than 1% was scored as a "pass", while a diffuse reflectance of equal to or greater than 1% was scored as a "fail".

[Heat Resistance of the Aluminum Vapor-Deposited Side]

The aluminum vapor-deposited light-reflecting body was then subjected to a heat treatment at 160° C. for 24 hours using a hot-air dryer (DN-43 forced convection, constant temperature oven, from YAMATO SCIENTIFIC CO., LTD.); the diffuse reflectance on the aluminum vapor-deposited side was measured at a wavelength of 550 nm by a specular reflection-excluded procedure using a spectrophotometer ("CM-3600d", from Konica Minolta, Inc.); and this diffuse reflectance was used as an indicator of the heat resistance. A diffuse reflectance after the heat treatment of less than 1% was scored as a "pass", while equal to or greater than 1% was scored as a "fail".

[Adhesiveness of the Aluminum Vapor-Deposited Side]

The aluminum vapor-deposited light-reflecting body was subjected to a heat treatment at 180° C. for 24 hours using a hot-air dryer (DN-43 forced convection, constant temperature oven, from YAMATO SCIENTIFIC CO., LTD.), and the adhesiveness of the aluminum vapor-deposited side was then evaluated by introducing a cut into the aluminum vapor-deposited side using a knife, pasting cellophane tape over this, and peeling off the cellophane tape. A score of "pass" was assigned when almost no peeling of the aluminum vapor-deposited film was seen, while a score of "fail" was assigned when peeling of the aluminum vapor-deposited film was substantial.

[Overall Evaluation of the Appearance]

A score of "+" was assigned when the arithmetic average roughness (Ra) and the maximum roughness height (Ry) were small and the aggregates, diffuse reflectance of the aluminum vapor-deposited side, heat resistance of the aluminum vapor-deposited side, and adhesiveness of the aluminum vapor-deposited side were all "pass", while a score of "x" was assigned when this was not true.

The results of these evaluations are given in Tables 2 and 3 below.

[Fogging Behavior]

The light-reflecting base body obtained as described above was pulverized in a pellet size; 5 g was introduced into a test tube (φ20×160 mm); and this was placed in a fogging tester (L-75 mid-size thermostat, from GL Sciences Inc., modified) that had been temperature regulated to 180° C. A heat-resistant glass lid (Tempax glass, cp25×2 mmt) was placed on the test tube and then the heat-resistant glass part was temperature regulated to a 25° C. atmosphere and a heat treatment was performed for 24 hours at 160° C. When the heat treatment was completed, a deposited material, due to, for example, decomposition products that had sublimed from the resin composition, was precipitated on the inner side of the heat-resistant glass plate. Using a "TC-HIIIDPK" haze meter from Tokyo Denshoku CO., LTD., the haze of the heat-resistant glass plate was measured after the completion of the heat treatment, and this was used as an indicator of the fogging behavior.

TABLE 2

| component | code | unit | examples | | | | | | | |
|---|---|---|---|---|---|---|---|---|---|---|
| | | | 1 | 2 | 3 | 4 | 5 | 6 | 7 | 8 |
| polybutylene terephthalate resin pellets | A1-1 | mass parts | 45.7 | 66.9 | 72.2 | 31.5 | 45.7 | 45.7 | 31.5 | 49.9 |
| | A1-2 | | | | | 39.1 | | | 39.1 | |
| polybutylene terephthalate resin powder | A2 | | 31.8 | 10.6 | 5.3 | 5.3 | 31.8 | 31.8 | 5.3 | 31.8 |
| polyethylene terephthalate resin | A3 | | 18.3 | 18.3 | 18.3 | 19.6 | 18.3 | 18.3 | 19.5 | 18.3 |
| styrenic resin | A4 | | 4.2 | 4.2 | 4.2 | 4.5 | 4.2 | 4.2 | 4.5 | |

TABLE 2-continued

| component | | code | unit | examples 1 | 2 | 3 | 4 | 5 | 6 | 7 | 8 |
|---|---|---|---|---|---|---|---|---|---|---|---|
| inorganic filler | calcium carbonate | B1 | | 4.1 | 4.1 | 4.1 | 4.3 | 4.1 | | 4.3 | 4.1 |
| | | B2 | | | | | | | | | |
| | | B3 | | | | | | | 4.1 | | |
| | talc | B4 | | | | | | | | | |
| mold releasing agent | | C1 | | 0.3 | 0.3 | 0.3 | 0.3 | | 0.3 | | |
| | | C2 | | | | | | 0.3 | | | 0.3 |
| | | C3 | | | | | | | | 0.3 | |
| stabilizer | | D | | 0.05 | 0.05 | 0.05 | 0.06 | 0.05 | 0.05 | 0.06 | 0.05 |
| carbon black | | E | | 1.3 | 1.3 | 1.3 | 1.3 | 1.3 | 1.3 | 1.3 | 1.3 |
| PBT powder/inorganic filler mass ratio | | — | | 89/11 | 72/28 | 56/44 | 55/45 | 89/11 | 89/11 | 55/45 | 89/11 |
| powder, sliding shear stress | | | N | <2 | <2 | 2.2 | 2.3 | <2 | <2 | 2.1 | <2 |
| flowability | MVR (265° C., 2.16 kgf) | | cm$^3$/10 min | 74 | 73 | 72 | 55 | 51 | 54 | 52 | 72 |
| shrinkage ratio | MD direction | | % | 1.6 | 1.6 | 1.6 | 1.6 | 1.6 | 1.6 | 1.6 | 1.7 |
| | TD direction | | % | 1.6 | 1.6 | 1.6 | 1.6 | 1.6 | 1.6 | 1.6 | 1.7 |
| mechanical strength | tensile strength at break | | MPa | 63 | 62 | 62 | 63 | 63 | 62 | 63 | 65 |
| | tensile elongation at break | | % | 3 | 3 | 3 | 3 | 3 | 3 | 3 | 3 |
| | maximum flexural strength | | MPa | 98 | 98 | 98 | 100 | 99 | 98 | 100 | 95 |
| | flexural modulus | | MPa | 3018 | 3013 | 3015 | 3020 | 3015 | 3005 | 3020 | 2910 |
| | notched Charpy impact strength | | kJ/m$^2$ | 3 | 3 | 3 | 3 | 3 | 3 | 3 | 3 |
| mold release properties | release resistance | | MPa | 5.4 | 5.5 | 5.5 | 5.4 | 7.5 | 5.2 | 12.5 | 7.9 |
| appearance | arithmetic average roughness Ra | | μm | 0.18 | 0.19 | 0.19 | 0.19 | 0.19 | 0.18 | 0.20 | 0.21 |
| | maximum roughness height Ry | | μm | 1.21 | 2.07 | 1.93 | 1.85 | 1.90 | 1.75 | 2.01 | 1.68 |
| | aggregates | | — | pass | pass | pass | pass | pass | pass | pass | pass |
| | diffuse reflectance of aluminum vapor-deposited side | | — | pass | pass | pass | pass | pass | pass | pass | pass |
| | heat resistance of aluminum vapor-deposited side | | — | pass | pass | pass | pass | pass | pass | pass | pass |
| | adhesiveness of aluminum vapor-deposited side | | — | pass | pass | pass | pass | pass | pass | pass | pass |
| | overall evaluation | | — | + | + | + | + | + | + | + | + |
| gas properties | fogging behavior | | % | 5.7 | 5.4 | 5.8 | 5.5 | 0.4 | 5.8 | 1.2 | 0.9 |

TABLE 3

| component | | code | unit | comparative examples 1 | 2 | 3 | 4 |
|---|---|---|---|---|---|---|---|
| polybutylene terephthalate resin pellets | | A1-1 | mass parts | 45.7 | 45.7 | 77.5 | |
| | | A1-2 | | | | | 38.1 |
| polybutylene terephthalate resin powder | | A2 | | 31.8 | 31.8 | | 38.0 |
| polyethylene terephthalate resin | | A3 | | 18.3 | 18.3 | 18.3 | 19.1 |
| styrenic resin | | A4 | | 4.2 | 4.2 | 4.2 | 4.8 |
| inorganic filler | calcium carbonate | B1 | | | | 4.1 | 25.4 |
| | | B2 | | 4.1 | | | |
| | | B3 | | | | | |
| | talc | B4 | | | 4.1 | | |
| mold releasing agent | | C1 | | 0.3 | 0.3 | 0.3 | 0.4 |
| | | C2 | | | | | |
| | | C3 | | | | | |
| stabilizer | | D | | 0.06 | 0.05 | 0.05 | 0.06 |
| carbon black | | E | | 1.3 | 1.3 | 1.3 | 1.3 |
| PBT powder/inorganic filler mass ratio | | | | 89/11 | 89/11 | — | 60/40 |
| powder, sliding shear stress | | | N | <2 | <2 | 10.8 | <2 |
| flow-ability | MVR (265° C., 2.16 kgf) | | cm³/10 min | 70 | 75 | 75 | 43 |
| shrinkage ratio | MD direction | | % | 1.7 | 1.6 | 1.6 | 1.3 |
| | TD direction | | % | 1.6 | 1.5 | 1.6 | 1.4 |
| mechanical strength | tensile strength at break | | MPa | 58 | 61 | 60 | 57 |
| | tensile elongation at break | | % | 3 | 3 | 3 | 3 |
| | maximum flexural strength | | MPa | 95 | 98 | 99 | 98 |
| | flexural modulus | | MPa | 3080 | 3012 | 3030 | 3613 |
| | notched Charpy impact strength | | kJ/m² | 2 | 3 | 3 | 1 |
| mold release properties | release resistance | | MPa | 5.1 | 4.8 | 5.3 | 5.0 |
| appearance | arithmetic average roughness Ra | | μm | 0.27 | 0.28 | 0.28 | 0.19 |
| | maximum roughness height Ry | | μm | 2.22 | 1.91 | 5.98 | 7.14 |
| | aggregates | | — | fail | fail | fail | fail |
| | diffuse reflectance of aluminum vapor-deposited side | | — | fail | fail | fail | fail |
| | heat resistance of aluminum vapor-deposited side | | — | — | — | pass | pass |
| | adhesiveness of aluminum vapor-deposited side | | — | pass | pass | pass | pass |
| | overall evaluation | | — | × | × | × | × |
| gas properties | fogging behavior | | % | 6.6 | 6.5 | 6.0 | 5.5 |

As is clear from the results in Table 2, the flowability, shrinkage ratio, mechanical strength, mold release properties, appearance, and gas properties are all shown to be excellent for the polyester resin compositions of Examples 1 to 8.

In particular, the polyester resin compositions of Examples 1 to 6 and 8, which used a mold releasing agent having an acid value of 10 to 40 mg KOH/g, are shown to exhibit a lower release resistance and thus better release properties than for Example 7.

On the other hand, Comparative Examples 1 and 2, which used an inorganic filler having an average primary particle diameter exceeding 2.5 μm, exhibit a fail with regard to aggregates and the diffuse reflectance on the aluminum vapor-deposited side. Comparative Example 3, which did not use a polyester resin powder, and Comparative Example 4, which had a large calcium carbonate content, have a large Ry and exhibit a fail with regard to aggregates. Thus, it is shown that a resin composition for which the flowability, shrinkage ratio, mechanical strength, mold release properties, appearance, and gas properties are all excellent was not obtained in any of the comparative examples.

INDUSTRIAL APPLICABILITY

The polyester resin composition of the present invention exhibits a low shrinkage ratio and excellent mold release properties while maintaining a high mechanical strength, also provides excellent surface properties and an excellent appearance for a molded article and an excellent surface appearance by a vapor-deposited product, and resists the production of fogging even during high-temperature use, and because of this the molded articles and light-reflecting base body produced by its injection molding can be directly vapor deposited with aluminum without a primer treatment. Moreover, the light-reflecting body produced by this aluminum vapor deposition has a very good appearance and can be advantageously used, for example, for vehicular lamps, e.g., for automobiles, and in particular for lamp extensions, and the industrial applicability is thus very high.

The invention claimed is:

1. A polyester resin composition, comprising:
   (A) a resin component comprising:
      (A1) polybutylene terephthalate resin pellets, and
      (A2) a polyester resin powder; and
   (B) an inorganic filler having an average primary particle diameter of not more than 2.5 μm,
   wherein:
   a content of the inorganic filler (B) is 0.1 to 20 mass parts per 100 mass parts of the resin component (A); and
   the inorganic filler (B) is at least one selected from the group consisting of calcium carbonate, talc, mica, silica, kaolin, barium sulfate and zirconium silicate.

2. The polyester resin composition according to claim 1, wherein a blend of the polyester resin powder (A2) and the inorganic filler (B) has a maximum sliding shear stress of not more than 8 N.

3. A polyester resin composition, comprising:
(A) a resin component comprising:
(A1) polybutylene terephthalate resin pellets, and
(A2) a polyester resin powder; and
(B) an inorganic filler having an average primary particle diameter of not more than 2.5 μm,
wherein:
a content of the inorganic filler (B) is 0.1 to 20 mass parts per 100 mass parts of the resin component (A); and
an average particle diameter of the polyester resin powder (A2) is 1000- to 8000-times the average primary particle diameter of the inorganic filler (B).

4. The polyester resin composition according to claim 1, wherein a content of the polyester resin powder (A2) is 1 to 50 mass % in the resin component (A).

5. The polyester resin composition according to claim 1, wherein an average particle diameter of the polyester resin powder (A2) is 100 to 1,500 μm.

6. The polyester resin composition according to claim 1, wherein a mass ratio (A2):(B) between contents of the polyester resin powder (A2) and the inorganic filler (B) is 30:70 to 95:5.

7. The polyester resin composition according to claim 1, wherein the polyester resin powder (A2) is a polybutylene terephthalate resin powder.

8. The polyester resin composition according to claim 1, wherein the inorganic filler (B) is at least one selected from the group consisting of calcium carbonate, talc, mica, silica, kaolin, and zirconium silicate.

9. The polyester resin composition according to claim 1, wherein the inorganic filler (B) is calcium carbonate.

10. The polyester resin composition according to claim 1, wherein the resin component (A) further comprises:
(A3) a polyethylene terephthalate resin, (A4) a styrenic resin, or both, and a content of the polyethylene terephthalate resin (A3), the styrenic resin (A4), or both, in the resin component (A) is 1 to 40 mass %.

11. The polyester resin composition according to claim 1, further comprising:
0.001 to 2 mass parts of a mold releasing agent having an acid value of 10 to 40 mg KOH/g, per 100 mass parts of the resin component (A).

12. The polyester resin composition according to claim 1, further comprising:
0.001 to 1 mass part of a hindered phenol stabilizer having a melting point of at least 150° C., per 100 mass parts of the resin component (A).

13. An injection molded article obtained by injection molding of the polyester resin composition according to claim 1.

14. The injection molded article according to claim 13, which is a light-reflecting base body.

15. A light-reflecting body, comprising a light-reflecting layer disposed on the light-reflecting base body according to claim 14.

16. The light-reflecting body according to claim 15, wherein the light-reflecting layer is formed of a metal thin film layer, and the metal thin film layer is in direct contact with a surface of the light-reflecting base body.

17. The polyester resin composition according to claim 1, wherein
a specific gravity of the inorganic filler (B) is not more than 3 g/cm$^3$; and
a surface of a molded article obtained by injection molding of the polyester resin composition has a maximum roughness height Ry of not more than 5.5 μm.

18. The polyester resin composition according to claim 17, wherein the surface of the molded article has an arithmetic average roughness Ra of not more than 0.25 μm.

19. The polyester resin composition according to claim 17, wherein the molded article in which an aluminum layer with a thickness of 150 nm is disposed on a surface has a diffuse reflectance of less than 1% on the aluminum layer side.

20. The polyester resin composition according to claim 3, wherein a blend of the polyester resin powder (A2) and the inorganic filler (B) has a maximum sliding shear stress of not more than 8 N.

* * * * *